US010749001B2

(12) United States Patent
Hirose et al.

(10) Patent No.: US 10,749,001 B2
(45) Date of Patent: Aug. 18, 2020

(54) METHOD OF EVALUATING INSULATED-GATE SEMICONDUCTOR DEVICE

(71) Applicant: Fuji Electric Co., Ltd., Kanagawa (JP)

(72) Inventors: Takayuki Hirose, Kanagawa (JP); Yutaka Terao, Tokyo (JP); Aki Takigawa, Tokyo (JP); Etsuko Tomita, Tokyo (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/209,790

(22) Filed: Dec. 4, 2018

(65) Prior Publication Data
US 2019/0172912 A1  Jun. 6, 2019

(30) Foreign Application Priority Data

Dec. 6, 2017  (JP) .................................. 2017-234451
Mar. 7, 2018  (JP) .................................. 2018-041085

(51) Int. Cl.
H01L 29/16  (2006.01)
H01L 21/66  (2006.01)
(Continued)

(52) U.S. Cl.
CPC ..... *H01L 29/1608* (2013.01); *G01N 21/3581* (2013.01); *G01N 21/41* (2013.01);
(Continued)

(58) Field of Classification Search
None
See application file for complete search history.

(56) References Cited

U.S. PATENT DOCUMENTS

2008/0220620 A1  9/2008  Kawada et al.
2012/0286291 A1  11/2012  Hiyoshi et al.
(Continued)

FOREIGN PATENT DOCUMENTS

JP  5509520 B2  6/2014
JP  5870672 B2  3/2016
(Continued)

OTHER PUBLICATIONS

Stout et al., "The Development of Methods for the Characterisation of Roughness in Three Dimensions", (European Commission Mar. 27, 2008), 12.4 (12-6), 12.7 (12-24, 12-25) (Mentioned in paragraph No. 67 of the as-filed specification.).

*Primary Examiner* — Herve-Louis Y Assouman
(74) *Attorney, Agent, or Firm* — Chen Yoshimura LLP

(57) ABSTRACT

A method of evaluating an insulated-gate semiconductor device having an insulated-gate structure including a channel formation layer made of a wide-bandgap semiconductor and a gate insulating film formed contacting the channel formation layer includes removing the gate insulating film in order to expose a surface of the channel formation layer; taking a phase image of the exposed surface of the channel formation layer using a phase mode of an atomic force microscope; evaluating a surface condition of the exposed surface of the channel formation layer by calculating an evaluation metric from phase shift values in the phase image and by determining whether the evaluation metric satisfies a prescribed condition; and determining that the insulated-gate semiconductor device is acceptable when the evaluation metric satisfied the prescribed condition.

7 Claims, 15 Drawing Sheets

(51) Int. Cl.

| | | |
|---|---|---|
| *H01L 21/04* | (2006.01) | |
| *H01L 29/66* | (2006.01) | |
| *H01L 29/78* | (2006.01) | |
| *H01L 29/34* | (2006.01) | |
| *G01N 21/3581* | (2014.01) | |
| *G01N 21/84* | (2006.01) | |
| *H01L 21/02* | (2006.01) | |
| *G01N 21/41* | (2006.01) | |
| *G01R 31/265* | (2006.01) | |
| *G01Q 60/30* | (2010.01) | |

(52) U.S. Cl.
  CPC .............. *G01N 21/84* (2013.01); *G01Q 60/30* (2013.01); *G01R 31/2656* (2013.01); *H01L 21/02378* (2013.01); *H01L 21/049* (2013.01); *H01L 22/14* (2013.01); *H01L 22/20* (2013.01); *H01L 22/24* (2013.01); *H01L 29/34* (2013.01); *H01L 29/66068* (2013.01); *H01L 29/78* (2013.01); *H01L 29/7813* (2013.01); *G01N 2021/4186* (2013.01); *G01N 2021/8461* (2013.01); *H01L 22/12* (2013.01)

(56) References Cited

U.S. PATENT DOCUMENTS

| | | | |
|---|---|---|---|
| 2013/0117895 A1* | 5/2013 | Proksch | G01Q 210/00 850/1 |
| 2013/0153925 A1* | 6/2013 | Masuda | H01L 29/7827 257/77 |
| 2016/0079418 A1* | 3/2016 | Murakoshi | H01L 29/7833 257/288 |

FOREIGN PATENT DOCUMENTS

| | | |
|---|---|---|
| JP | 5880429 B2 | 3/2016 |
| WO | 2007/139146 A1 | 12/2007 |

\* cited by examiner

METHOD OF EVALUATING INSULATED-GATE SEMICONDUCTOR DEVICE

BACKGROUND OF THE INVENTION

Technical Field

The present invention relates to a method of evaluating an insulated-gate semiconductor device.

Background Art

In insulated-gate semiconductor devices made of a wide-bandgap semiconductor, improving field-effect mobility at the interface between the gate insulating film and the channel formation layer in which the inversion layer forms (the body) is a critical design objective. For example, Patent Document 1 describes that planarizing the surface of silicon carbide (SiC) with a chemical mechanical polishing (CMP) process so as to have the arithmetic average surface roughness Ra of 0.1 nm or less makes it possible to improve field-effect mobility.

Moreover, Patent Document 2 discloses a technology in which a 1700° C. argon (Ar) annealing process and a 1500° C. hydrogen ($H_2$) annealing process are used to planarize the shape of a trench surface that forms an interface and to thereby reduce protrusions and recesses in that surface. Furthermore, Patent Document 3 discloses a gate insulating film formation technology in which after performing a sacrificial oxidation process, a gate insulating film is formed on the surface of an SiC semiconductor layer using a chemical vapor deposition (CVD) process, and then a heat treatment is performed in a nitrogen monoxide (NO) atmosphere. Moreover, Patent Document 4 discloses that side walls of an SiC-MOSFET gate trench with surface roughness (root-mean-square roughness (RMS)) of 1.0 nm or less can reduce channel resistance. However, even when using the technologies disclosed in Patent Documents 1 to 4, the field-effect mobility that can be achieved is still insufficient, and there remains to be demand for technologies that can yield additional improvements.

RELATED ART DOCUMENTS

Patent Documents

Patent Document 1: WO 2007/139146
Patent Document 2: Japanese Patent No. 5509520
Patent Document 3: Japanese Patent No. 5880429
Patent Document 4: Japanese Patent No. 5870672

SUMMARY OF THE INVENTION

The present inventors have investigated and revealed that evaluation using only the arithmetic average roughness Ra, which is a general metric representing the surface roughness, shows less correlation between the arithmetic average roughness Ra and the field-effect mobility and is insufficient for characteristics analysis of the field-effect mobility. The present invention was made in view of the problem described above and aims to provide a method of evaluating an insulated-gate semiconductor device that can provide precise field-effect mobility analysis.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method of evaluating an insulated-gate semiconductor device having an insulated-gate structure including a channel formation layer made of a wide-bandgap semiconductor and a gate insulating film formed contacting the channel formation layer, including: removing the gate insulating film in order to expose a surface of the channel formation layer; taking a phase image of the exposed surface of the channel formation layer using a phase mode of an atomic force microscope; evaluating a surface condition of the exposed surface of the channel formation layer by calculating an evaluation metric from phase shift values in the phase image and by determining whether the evaluation metric satisfies a prescribed condition; and determining that the insulated-gate semiconductor device is acceptable when the evaluation metric satisfied the prescribed condition.

The present invention makes it possible to provide a method of evaluating an insulated-gate semiconductor device that can provide precise field-effect mobility analysis.

It is to be understood that both the foregoing general description and the following detailed description are exemplary and explanatory, and are intended to provide further explanation of the invention as claimed.

DETAILED DESCRIPTION OF EMBODIMENTS

Figure 1:
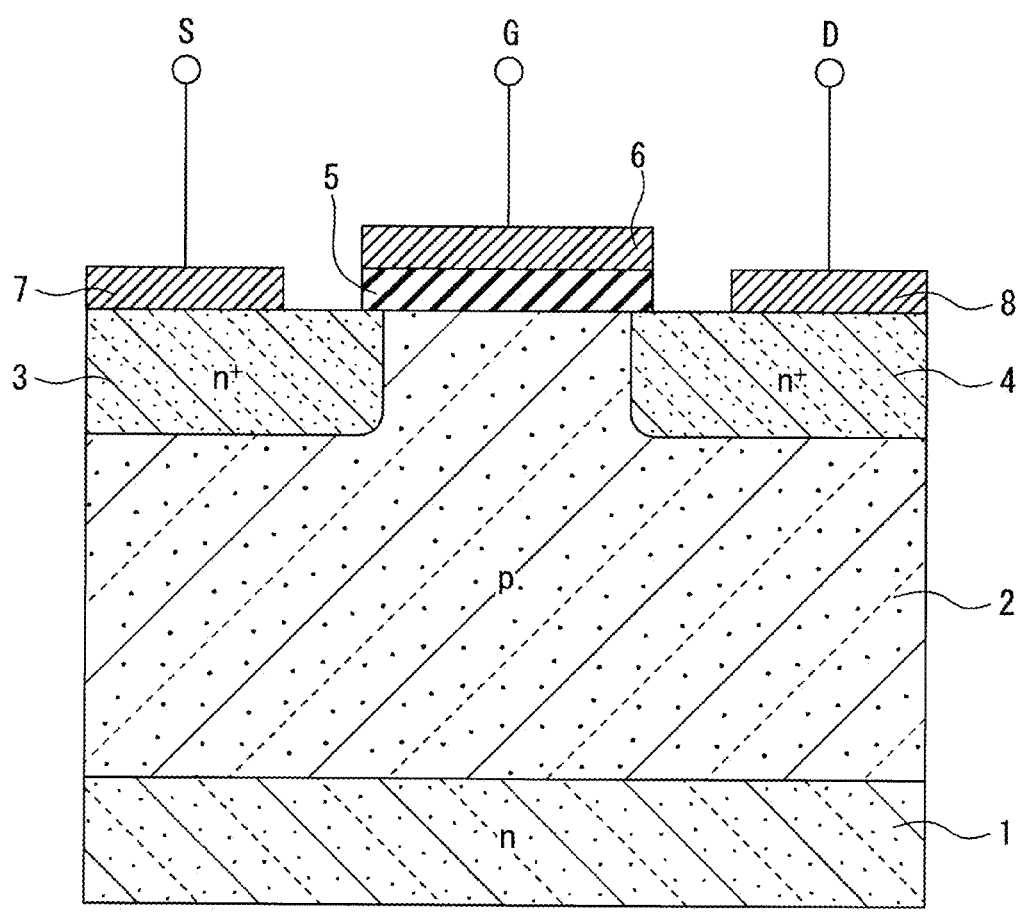
FIG. 1 is a cross-sectional view schematically illustrating a planar-gate insulated-gate semiconductor device manufactured in Embodiment 1 of the present invention.

Next, Embodiments 1 to 3 of the present invention will be described. In the following descriptions of the figures, the same or similar reference characters are used for components that are the same or similar. Note, however, that the figures are only intended to be schematic illustrations, and the relationships between thickness and planar dimensions, the proportions between the thicknesses of each device and each component, and the like may be different from in the actual devices. Therefore, specific thicknesses and dimensions should be determined by referring to the descriptions below. Similarly, the illustrated dimensional relationships and proportions of components in the figures may differ from one figure to the next.

Moreover, in the following descriptions, the "left and right" and the "up and down" directions are defined only for the purposes of convenience and do not limit the technical concepts of the present invention in any way. Therefore, the figures may be rotated by 90° such that the "left and right" and the "up and down" directions are interchanged, or the figures may be rotated by 180° such that the "left" direction becomes the "right" direction and the "right" direction becomes the "left" direction, for example. Furthermore, although the following descriptions assume that a "first conductivity type" is n-type and that a "second conductivity type" is p-type as an example, the conductivity types may be selected in the opposite manner such that the first conductivity type is p-type and the second conductivity type is n-type. In addition, the + and − symbols are appended to the letters n and p as superscripts to indicate that the corresponding semiconductor region has a higher or lower impurity concentration, respectively, than a semiconductor region for which the + and − symbols are not appended.

Embodiment 1

<Structure of Insulated-Gate Semiconductor Device>

As illustrated in FIG. 1, an insulated-gate semiconductor device manufactured in Embodiment 1 of the present invention is a MOSFET including an n-type SiC semiconductor substrate 1 and a p-type SiC channel formation layer 2 formed on the semiconductor substrate 1. A high-impurity concentration n-type ($n^+$) source region 3 and a high-impurity concentration n-type ($n^+$) drain region 4 separated from the source region 3 are respectively selectively formed in an upper portion of the channel formation layer 2. The structure illustrated in FIG. 1 is only an example. The channel formation layer 2 may be a well region or the like embedded in an upper portion of the semiconductor substrate 1, or a p-type semiconductor substrate may be used as-is as the channel formation layer 2. Furthermore, in the structure illustrated in FIG. 1, a low-impurity concentration n-type drift region may be formed sandwiched between the channel formation layer 2 and the drain region 4.

A gate insulating film 5 is formed on the upper surface of the channel formation layer 2 sandwiched between the source region 3 and the drain region 4, and a gate electrode 6 is formed on the gate insulating film 5. Moreover, a source electrode 7 and a drain electrode 8 are respectively formed on and in ohmic contact with the source region 3 and the drain region 4. Components such as an interlayer insulating film and a field insulating film are not illustrated in the figure. Together, the gate insulating film 5 and the channel formation layer 2 contacting the gate insulating film 5 form an insulated-gate structure.

<Method of Manufacturing Insulated-Gate Semiconductor Device>

(a) In a method of manufacturing the insulated-gate semiconductor device according to Embodiment 1, first, an n-type semiconductor substrate 1 made of monocrystalline 4H SiC (4H—SiC) is prepared, for example. Then, using an epitaxial growth process or the like, an SiC semiconductor layer is deposited on the (1-100) plane of the semiconductor substrate 1, for example, so as to form the p-type channel formation layer 2 illustrated in FIG. 1.

(b) Next, using a CVD process or the like, a mask insulating film made of $SiO_2$, for example, is formed on the channel formation layer 2. Then, a photoresist film is applied on the mask insulating film, and a photolithography technology is used to form an etching mask pattern in the photoresist film. Next, using this etching mask, the mask insulating film is selectively etched and patterned. Then, using the two-layer structure constituted by the photoresist film and the patterned mask insulating film as an ion implantation mask, n-type impurities such as nitrogen (N) are ion-implanted. This ion implantation process respectively forms, in an upper portion of the channel formation layer 2, an n-type ion implantation layer which will become the source region 3 as well as an n-type ion implantation layer which will become the drain region 4. Next, the two-layer mask for ion implantation constituted by the photoresist film and the mask insulating film are removed, and a high-temperature activation annealing process is performed at approximately 1600° C. to activate the n-type ion implantation layers, thereby forming the source region 3 and the drain region 4 illustrated in FIG. 1.

(c) Then, an etching or annealing process is performed on the channel formation layer 2 whose upper portion has the source region 3 and drain region 4 embedded therein in order to reduce the variation in charge distribution of the upper surface of the channel formation layer 2 where the channel will form.

(d) Next, a high temperature silicon oxide (HTO) film is formed on the channel formation layer 2, and an annealing process is performed in a nitrogen monoxide (NO) atmosphere, for example, in order to form a silicon oxide film on the channel formation layer 2. Then, using a photolithography technology and an etching technology, the silicon oxide film is patterned into a prescribed shape to form the gate insulating film 5 as illustrated in FIG. 1.

(e) Next, using a CVD process or the like, a polycrystalline silicon film doped with impurities (a doped polysilicon film) is deposited on the upper surface of the channel formation layer 2 on which the gate insulating film 5 is formed. Then, using a photolithography technology and an etching technology, the doped polysilicon film is patterned into a prescribed shape to form the gate electrode 6 as illustrated in FIG. 1.

Next, using a CVD process or the like, an interlayer insulating film such as an $SiO_2$ film (not illustrated in the figure) is deposited over the entire surface so as to cover the gate electrode 6. Then, using a photolithography technology and an etching technology, the interlayer insulating film is patterned to form contact holes so as to partially expose the respective upper surfaces of the source region 3 and the drain region 4. Next, using a sputtering process or the like, a metal film containing titanium (Ti), aluminum (Al) or the like is deposited over the entire surface so as to cover the contact holes. Then, using a photolithography technology and an etching technology or the like, the deposited metal film is patterned into a desired shape, thereby respectively forming the source electrode 7 and the drain electrode 8 illustrated in FIG. 1. This completes the insulated-gate semiconductor device according to Embodiment 1. Furthermore, although this is not illustrated in the figure, a passivation film may be deposited over the entire surface so as to cover the source electrode 7 and the drain electrode 8, and then openings may be formed in the passivation film and electrode pads may be patterned inside these openings.

<Method of Evaluating Charge Distribution at Interface>

Next, using an atomic force microscope (AFM), the following procedure including steps (f1) to (f7) is performed to evaluate the charge distribution at the interface between the gate insulating film 5 and the SiC channel formation layer 2 of the insulated-gate semiconductor device having the structure schematically illustrated in FIG. 1. In this disclosure, the charge distribution is evaluated by measuring the phase distribution as determined by the AFM. First, using a wet process performed with an aqueous HF solution, for example, the gate insulating film 5 of the insulated-gate semiconductor device illustrated in FIG. 1 is removed to expose the upper surface of the channel formation layer 2.

(f1) Obtain Phase Image

Figure 2:
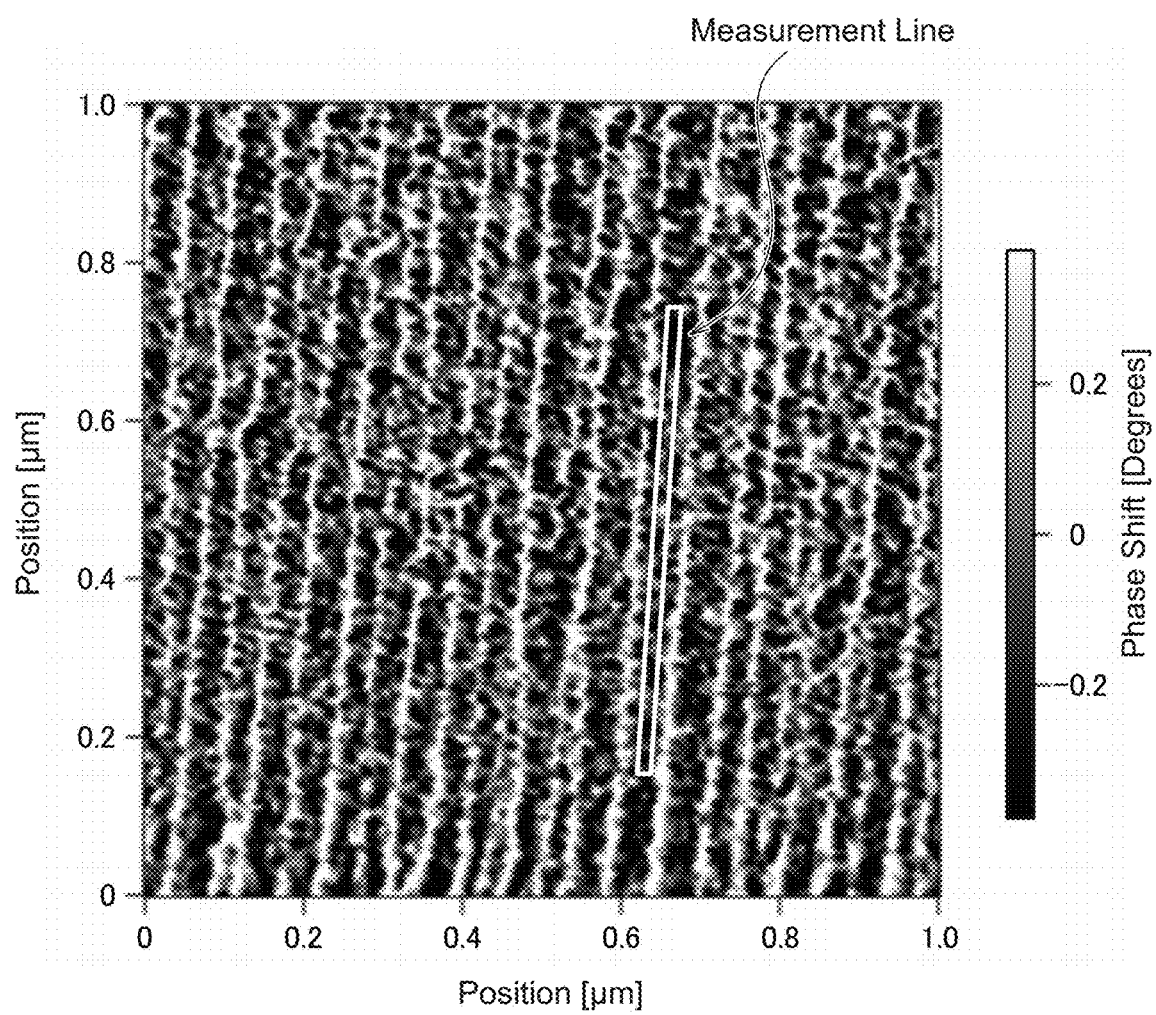
FIG. 2 is a phase image obtained by using an atomic force microscope to measure measuring the surface of a channel formation layer which forms an interface with a gate insulating film in the insulated-gate semiconductor device in Comparison Example 1.

Next, with the probe on the end of the cantilever of the AFM kept near the upper surface of the channel formation layer 2, the probe is moved over a region of prescribed size on that surface, and the change in phase in response to the oscillating motion of the cantilever of the AFM is measured. In other words, an AFM phase mode measurement is used to obtain phase image data for the region over which the probe is moved. FIG. 2 shows an example phase image for a square 1.0 μm×1.0 μm region, where this phase-imaged region is color-mapped with positions that yield increasingly large delays in phase being depicted in increasingly dark black colors and positions that yield increasingly large advances in phase being depicted in increasingly light white colors. Below, phase changes in the form of advances or delays will be collectively referred to simply as "phase shift". The phase image shown in FIG. 2 is data obtained with respect to the upper surface of the channel formation layer of an insulated-gate semiconductor device according to Comparison Example 1 described below.

(f2) Set Measurement Segment

Next, a linear measurement segment of prescribed length is set in the obtained phase image data. In order to improve evaluation accuracy, it is generally preferable from experience that the length of the measurement segment be set to at least 60% of the length of one side of the square-shaped phase image region. FIG. 2 exemplifies the measurement line of approximately 0.6 μm in length as the measurement segment. As shown in FIG. 2. the linear measurement segment should be defined so as to avoid crossing vertically extending lines that are due to step structures on the surface.

(f3) Extract Phase Shift

Figure 3:
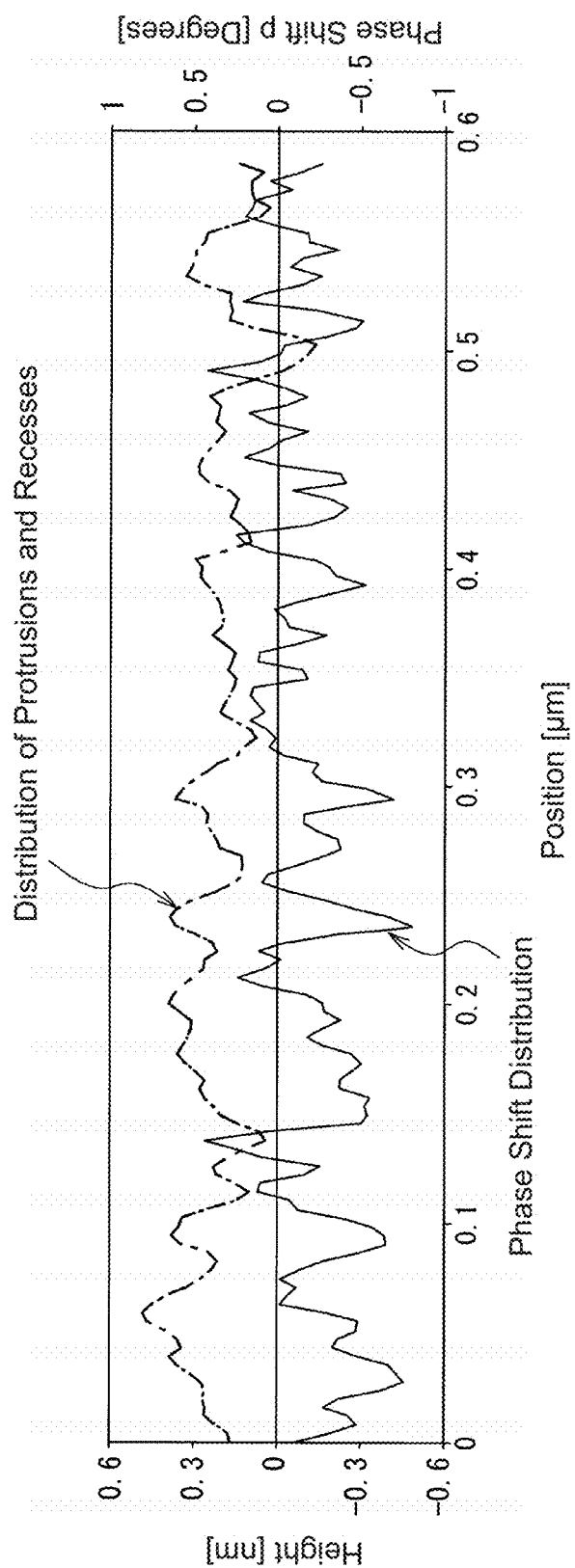
FIG. 3 is a graph showing a phase shift distribution and a distribution of protrusions and recesses for a measurement segment in FIG. 2.

Next, the phase shift over the measurement segment is extracted. In FIG. 3, the solid line on the lower side represents the distribution in phase shift p along the measurement segment illustrated in FIG. 2. Here, phase delay corresponds to negative phase shift (p<0), and phase advance corresponds to positive phase shift (p>0). Moreover, the chain-dotted line on the upper side in FIG. 3 represents the distribution of protrusions and recesses in the surface profile of the same measurement segment. Comparing the phase shift distribution to the distribution of protrusions and recesses makes it clear that even among protrusion regions that are higher than the surrounding regions, there are both positions where the phase shift p is negative as well as positions where the phase shift p is positive. In other words, there is no obvious correlation between the phase shift distribution and the distribution of protrusions and recesses even along the same measurement segment.

(f4) Set Measurement Segment Regions $A_i$

Figure 4:
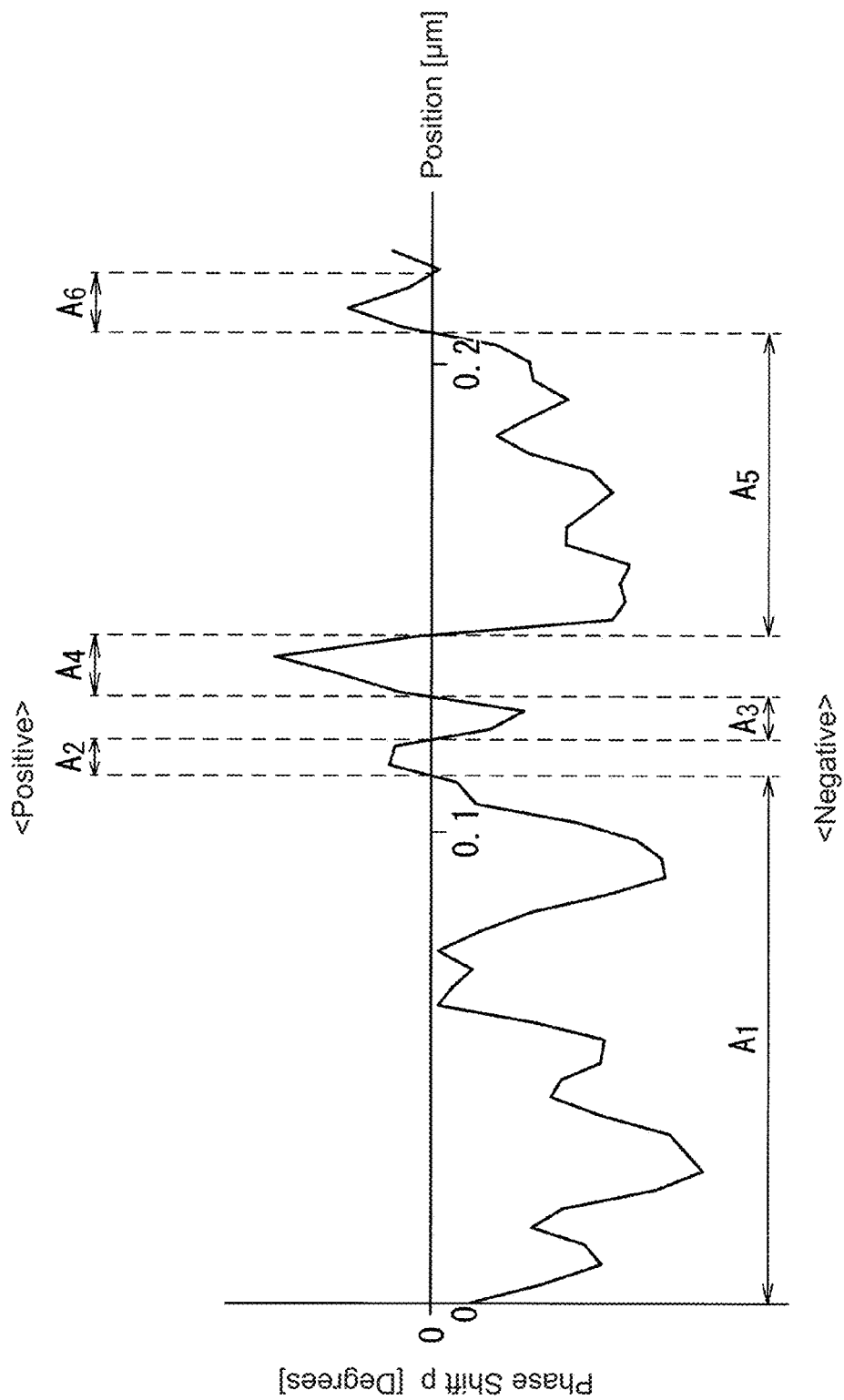
FIG. 4 is a graph schematically illustrating a procedure for setting measurement segment regions in a method of evaluating the insulated-gate semiconductor device according to Embodiment 1.

Next, the measurement segment is divided into regions in which the phase shift p data is continuously negative (p<0) and regions in which the phase shift p data is continuously positive (p>0), which are then respectively set as i measurement segment regions $A_i$. Here, i is an integer greater than or equal to 2. FIG. 4 illustrates an example for explaining how these measurement segment regions $A_i$ are set. Here, there are three negative (p<0) measurement segment regions $A_1$, $A_3$, and $A_5$ as well as three positive (p>0) measurement segment regions $A_2$, $A_4$, and $A_6$. For simplicity, FIG. 4 shows only a selectively extracted portion from a position of 0 μm to approximately 0.22 μm in the phase shift distribution data illustrated in FIG. 3.

(f5) Determine Quantity $\Delta D_i'' \times p_i(ave)$

Next, the width $\Delta D_i$ of each of the measurement segment regions $A_i$ that were set is obtained. For example, the width $\Delta D_1$ of the measurement segment region $A_1$ near the left side of FIG. 4, which has a negative phase shift p (p<0), is approximately 0.11 μm. Next, the average phase shift $p_i(ave)$ of each of the measurement segment regions $A_i$ is calculated. For the calculation of the average, either arithmetic mean or geometric mean may be used. But in the various Examples described below, the arithmetic mean of the phase shift values p included in the measurement segment regions $A_i$ is used as the average phase shift $p_i(ave)$. Then, for each of the measurement segment regions $A_i$, the quantity $\Delta D_i^n \times p_i(ave)$ is calculated. Here, n is an exponent power to which the value $\Delta D_i$ is raised.

(f6) Calculate Average μ and Standard Deviation σ

After calculating the quantity $\Delta D_i^n \times p_i(ave)$ for each of the group of measurement segment regions for which p<0 and the group of measurement segment regions for which p>0, the average and the standard deviation σ of each group are calculated. For example, in FIG. 4, for the group of measurement segment regions for which p<0, the quantities $\Delta D_1^n \times p_1(ave)$, $\Delta D_3^n \times p_3(ave)$, and $\Delta D_5^n \times p_5(ave)$ for which the phase shift p is negative (p<0) are respectively calculated for the three measurement segment regions $A_1$, $A_3$, and $A_5$. Then, the negative average $\mu_{(p<0)}$ and the standard deviation $\sigma_{(p<0)}$ are calculated from the three quantities $\Delta D_1^n \times p_1(ave)$, $\Delta D_3^n \times p_3(ave)$, and $\Delta D_5^n \times p_5(ave)$.

For example, the average $\mu_{(p<0)}$ and standard deviation $\sigma_{(p<0)}$ of the three quantities $\Delta D_1^n \times p_1(ave)$, $\Delta D_3^n \times p_3(ave)$, and $\Delta D_5^n \times p_5(ave)$ for which the phase shift p is negative (p<0) are respectively calculated as follows.

Average $\mu_{(p<0)} = \{\Delta D_1^n \times p_1(ave) + \Delta D_3^n \times p_3(ave) + \Delta D_5^n \times p_5(ave)\}/3$ Standard Deviation $\sigma_{(p<0)} = \sqrt{([\{\Delta D_1^n \times p_1(ave) - \mu_{(p<0)}\}^2 + \{\Delta D_3^n \times p_3(ave) - \mu_{(p<0)}\}^2 + \{\Delta D_5^n \times p_5(ave) - \mu_{(p<0)}\}^2]/3)}$ Similarly, the quantities $\Delta D_2^n \times p_2(ave)$, $\Delta D_4^n \times p_4(ave)$, and $\Delta D_6^n \times p_6(ave)$ for which the phase shift p is positive (p>0) are respectively calculated for the three measurement segment regions $A_2$, $A_4$, and $A_6$, and the positive average $\mu_{(p>0)}$ and the standard deviation $\sigma_{(p>0)}$ are calculated from the three quantities $\Delta D_2^n \times p_2(ave)$, $\Delta D_4^n \times p_4(ave)$, and $\Delta D_6^n \times p_6(ave)$.

(f7) Calculate Evaluation Metric

Here, the average $\mu_{(p<0)}$ and standard deviation $\sigma_{(p<0)}$ for when the phase shift p is negative as well as the average $\mu_{(p>0)}$ and standard deviation $\sigma_{(p>0)}$ for when the phase shift p is positive can be used as-is as metrics for evaluating field-effect mobility. However, research performed by the present inventors revealed that when the phase shift p is negative, increasingly small values of the average $\mu_{(p<0)}$ and standard deviation $\sigma_{(p<0)}$ yield increasingly high field-effect mobility, whereas when the phase shift p is positive, increasingly large values of the average $\mu_{(p>0)}$ and standard deviation $\sigma_{(p>0)}$ yield increasingly high field-effect mobility. In other words, the tendency for field-effect mobility to increase or decrease differs depending on whether the phase shift is positive or negative.

Therefore, in order to make these values more convenient for use as evaluation metrics, the present inventors defined a corrected average difference Δμ, which is a value obtained by subtracting the average $\mu_{(p>0)}$ for when the phase shift p is positive from the absolute value $|\mu_{(p<0)}|$ of the average $\mu_{(p<0)}$ for when the phase shift p is negative.

Corrected Average Difference $\Delta\mu = |\text{Average } \mu_{(p<0)}| - (\text{Average } \mu_{(p>0)})$ (1)

When using the corrected average difference Δμ defined by equation (1) as an evaluation metric, this corrected average difference Δμ becomes increasingly small as the average $\mu_{(p>0)}$ of the quantities $\Delta D_i^n \times p_i(ave)$ for the group of regions for which the phase shift is positive becomes increasingly large.

Moreover, in order to similarly make standard deviation σ more convenient for use as an evaluation metric, the present inventors defined a standard deviation difference Δσ, which is a value obtained by subtracting the standard deviation $\sigma_{(p>0)}$ for when the phase shift p is positive from the standard deviation $\sigma_{(p<0)}$ for when the phase shift p is negative.

Standard Deviation Difference $\Delta\sigma = (\text{Standard Deviation } \sigma_{(p<0)}) - (\text{Standard Deviation } \sigma_{(p>0)})$ (2)

When using the standard deviation difference Δσ defined by equation (2) as an evaluation metric, this standard deviation difference Δσ becomes increasingly small as the standard deviation $\sigma_{(p>0)}$ of the quantities $\Delta D_i^n \times p_i(ave)$ for the group of regions for which the phase shift is positive becomes increasingly large.

Thus, the corrected average difference Δμ and the standard deviation difference Δσ of the measurement segment are calculated using equation (1) and equation (2).

Figure 5A:
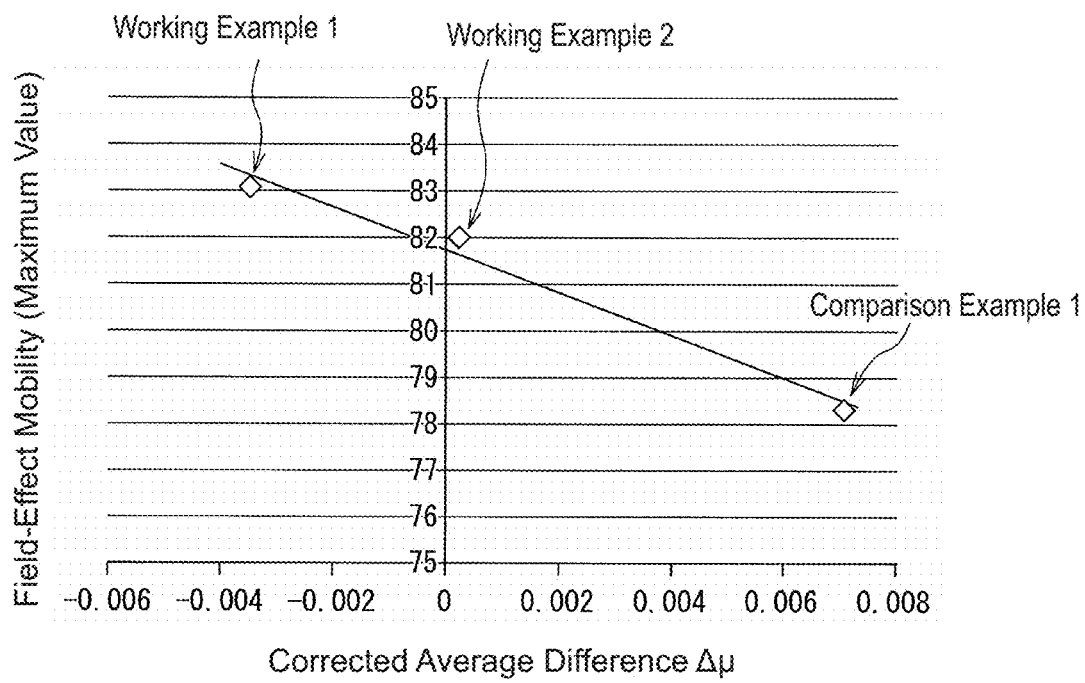
FIG. 5A is a graph showing the relationship between a corrected average difference $\Delta\mu$ and the maximum value of field-effect mobility for when n=1 in a quantity $\Delta D_i'' \times p_i(ave)$ used in the method of evaluating the insulated-gate semiconductor device.
Figure 5B:
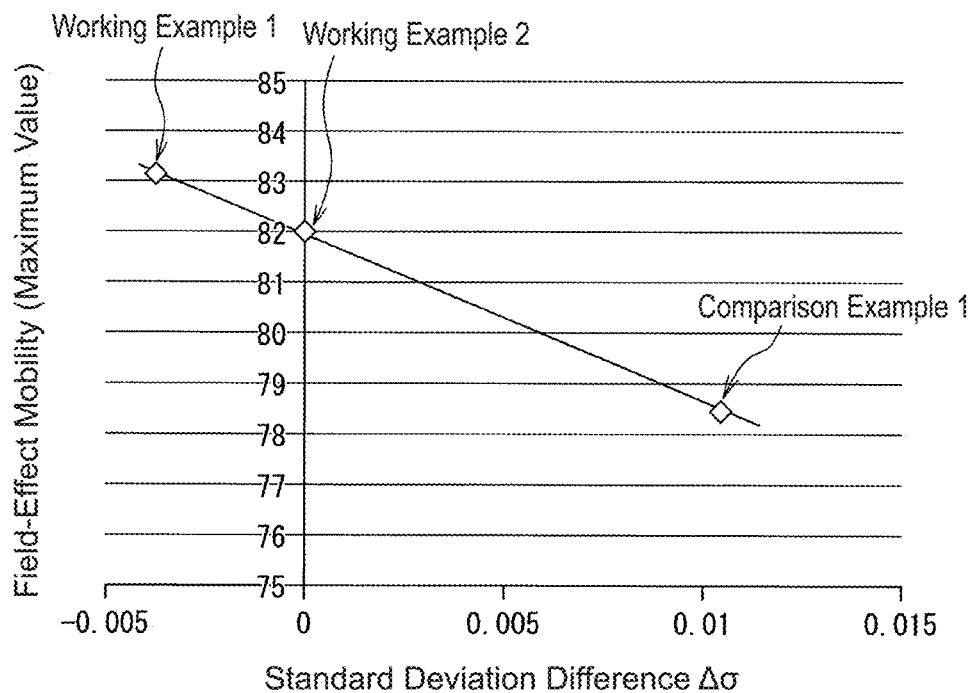
FIG. 5B is a graph showing the relationship between a standard deviation difference $\Delta\sigma$ and the maximum value of field-effect mobility for when n=1.

FIGS. 5A and 5B are line graphs illustrating correspondence tables for when the exponent n in the quantity $\Delta D_i^n \times p_i(ave)$ is set to n=1 to obtain the quantity $\Delta D_i^n \times p_i(ave)$. FIG. 5A shows the correspondence between the corrected average difference Δμ and the maximum value of field-effect mobility as calculated for insulated-gate semiconductor devices according to Working Example 1, Working Example 2, and Comparison Example 1. Moreover, FIG. 5B shows the correspondence between the standard deviation difference Δσ and the maximum value of field-effect mobility as calculated for the insulated-gate semiconductor devices according to Working Example 1, Working Example 2, and Comparison Example 1. First, the methods of manufacturing the insulated-gate semiconductor devices according to Working Example 1, Working Example 2, and Comparison Example 1 will be respectively described.

Working Example 1

In Working Example 1, a 4H—SiC substrate having the principal surface of (1-100) is used. The principal surface will be set similarly in other working examples that will be described later. During manufacture of the insulated-gate semiconductor device according to Working Example 1 of Embodiment 1, an inductively coupled plasma (ICP) etching process was used in step (c) for reducing variation in charge distribution to improve the SiC surface. The gas species used in this ICP etching process were Ar, $SF_6$, $O_2$, and $SiF_4$. Moreover, in step (d) for forming the gate insulating film 5, an HTO film was formed, and then an annealing process was performed at a temperature of approximately 1250° C. in a nitrogen monoxide (NO) atmosphere for approximately 60 minutes in order to form a silicon oxide film with a film thickness of approximately 100 nm as the gate insulating film 5 illustrated in FIG. 1. Between step (c) and step (d) the semiconductor substrate 1 illustrated in FIG. 1 was exposed to the air.

Next, steps (e) and after were performed to produce a plurality of insulated-gate semiconductor devices, and a sample was selected from among the manufactured insulated-gate semiconductor devices to serve as the insulated-gate semiconductor device according to Working Example 1. Upon measuring field-effect mobility in this sample, the maximum value of the field-effect mobility was found to be approximately 83 $cm^2/Vs$. Next, a wet process was performed using an aqueous HF solution with a concentration of 50% for 5-10 minutes at room temperature to remove the silicon oxide film constituting the gate insulating film 5.

Then, the upper surface of the SiC channel formation layer 2 formed on the (1-100) plane interface of the semiconductor substrate 1 was exposed, and the probe on the cantilever of an AFM was brought near this exposed upper surface and oscillated. The cantilever of the AFM used was made of silicon (Si) and had the following product specifications: an oscillation frequency of 300 kHz, and a spring constant of 26 N/m.

Moreover, other settings related to the AFM were configured as follows.

Measurement Mode: Repulsive force mode
Target Amplitude: 1 V
Target Percent: −10%
Measurement Scanning Range: 1 μm×1 μm
Scanning Frequency: 1 Hz
Measurement Points: 256×256
Scan Angle of Probe: 0°

Next, phase image data was obtained for a 1.0 μm×1.0 μm square region, and a linear measurement segment of approximately 0.6 μm in length, which is similar to the linear measurement segment shown in FIG. 2, was set within the obtained phase image data. As shown in FIGS. 5A and 5B, the corrected average difference $\Delta\mu$ of the measurement segment in Working Example 1 was −0.0035, and the standard deviation difference $\Delta\sigma$ was −0.0037.

Working Example 2

In the method of manufacturing the insulated-gate semiconductor device according to Working Example 2 of Embodiment 1, a high-temperature hydrogen annealing process was performed in step (c) at approximately 90 Torr (approximately $1.2\times10^4$ Pa) and approximately 1500° C. for approximately 18 minutes in order to improve the SiC surface. The $H_2$ concentration was 100%. Moreover, similar to in Working Example 1, in step (d), an HTO film was formed, and then an annealing process was performed at a temperature of approximately 1250° C. in a nitrogen monoxide (NO) atmosphere for approximately 60 minutes in order to form a silicon oxide film with a film thickness of approximately 100 nm as the gate insulating film 5 illustrated in FIG. 1. Between step (c) and step (d) the semiconductor substrate 1 illustrated in FIG. 1 was exposed to the air.

Next, steps (e) and after were performed to produce insulated-gate semiconductor devices, and a sample was selected from among the manufactured insulated-gate semiconductor devices to serve as the insulated-gate semiconductor device according to Working Example 2. Upon measuring field-effect mobility of this sample, the maximum value of the field-effect mobility was found to be approximately 82 $cm^2/Vs$. Then, the charge distribution evaluation including steps (f1) to (f7) was performed in the same manner as in Working Example 1 to calculate the corrected average difference $\Delta\mu$ or the standard deviation difference $\Delta\sigma$. The conditions under which the silicon oxide film, which will serve as the gate insulating film 5, was removed, the specifications of the AFM cantilever, the method of setting the measurement segment, and the like were all the same as in Working Example 1. As shown in FIGS. 5A and 5B, the corrected average difference $\Delta\mu$ of the measurement segment in Working Example 2 was 0.0002, and the standard deviation difference $\Delta\sigma$ was −0.0001.

Comparison Example 1

In the method of manufacturing the insulated-gate semiconductor device according to Comparison Example 1, a sacrificial thermal oxidation process was performed in step (c) at 1 atm and approximately 1100° C. for approximately 10 minutes in an oxygen ($O_2$) atmosphere in order to form a thermal oxidation film and to thereby improve the SiC surface. Then, the thermal oxidation film was removed using an aqueous HF solution. Moreover, similar to in Working Example 1, in step (d), an HTO film was formed, and then an annealing process was performed at a temperature of approximately 1250° C. in an NO atmosphere for approximately 60 minutes in order to form a silicon oxide film with a film thickness of approximately 100 nm as the gate insulating film 5 illustrated in FIG. 1. Between step (c) and step (d) the semiconductor substrate 1 illustrated in FIG. 1 was exposed to the air. Next, steps (e) and after were performed to produce insulated-gate semiconductor devices.

Then, a sample was selected from among the manufactured insulated-gate semiconductor devices to serve as the insulated-gate semiconductor device according to Comparison Example 1, and upon measuring field-effect mobility in this sample, the maximum value of the field-effect mobility was found to be approximately 78 $cm^2/Vs$. Next, the charge distribution evaluation including steps (f1) to (f7) was performed to calculate the corrected average difference $\Delta\mu$ or the standard deviation difference $\Delta\sigma$. The conditions under which the silicon oxide film, which will serve as the gate insulating film 5, was removed, the specifications of the AFM cantilever, the method of setting the measurement segment, and the like were all the same as in Working Example 1. As shown in FIGS. 5A and 5B, the corrected average difference $\Delta\mu$ of the measurement segment in Comparison Example 1 was 0.0071, and the standard deviation difference $\Delta\sigma$ was 0.0104.

FIGS. 5A and 5B show the results of Working Example 1, Working Example 2, and Comparison Example 1. As shown by Working Example 1 and Working Example 2 in FIG. 5A, when the corrected average difference $\Delta\mu$ is controlled so as to be less than or equal to 0 ($\Delta\mu\leq0$), a field-effect mobility of 81.7 or higher can be achieved. Moreover, as shown by Working Example 1 and Working Example 2 in FIG. 5B, when the standard deviation difference $\Delta\sigma$ is controlled so as to be less than or equal to 0 ($\Delta\sigma\leq0$), a field-effect mobility of 82 or higher can be achieved. On the contrary, in Comparison Example 1, the sacrificial oxidation process for forming the thermal oxidation film likely created a bias in the charge distribution, thereby causing field-effect mobility to decrease in comparison to in Working Example 1 and Working Example 2. This was likely because during the sacrificial oxidation process, a large amount of oxygen in the process atmosphere came into contact with the upper surface of the channel formation layer 2, thereby promoting a reaction between this oxygen and the silicon in the SiC. As a result, the carbon in the SiC precipitated at the interface and formed a large number of carbon bonds, thereby increasing the number of traps which reduce field-effect mobility.

Figure 6A:
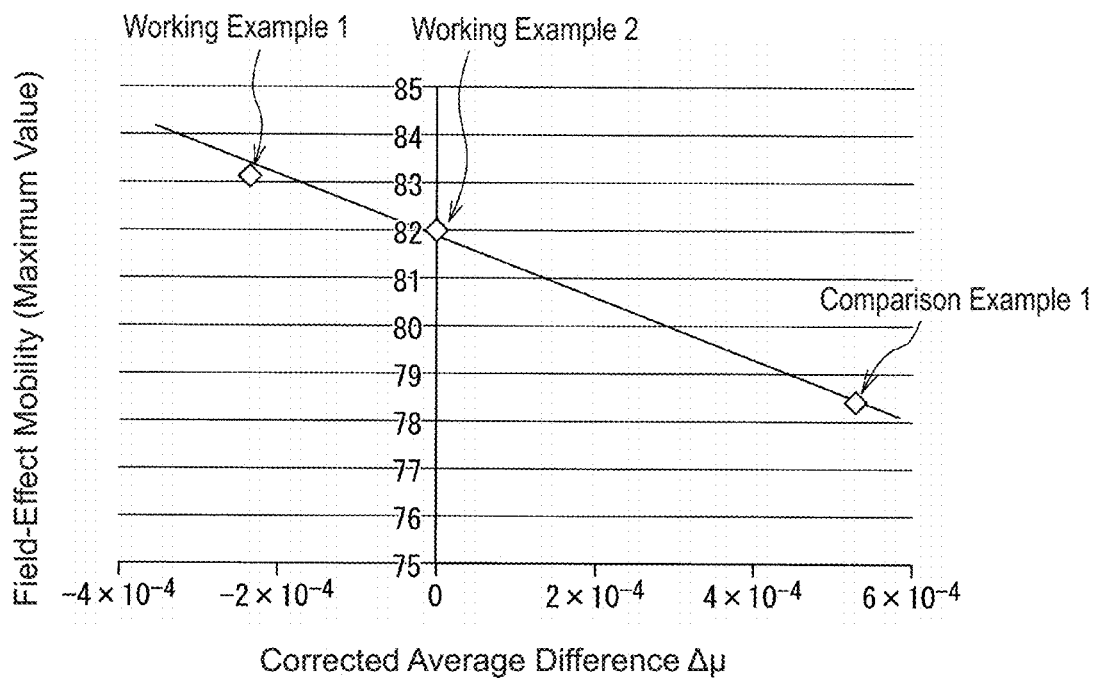
FIG. 6A is a graph showing the relationship between the corrected average difference $\Delta\mu$ and the maximum value of field-effect mobility for when n=2 in the quantity $\Delta D_i'' \times p_i(ave)$ used in the method of evaluating the insulated-gate semiconductor device.
Figure 6B:
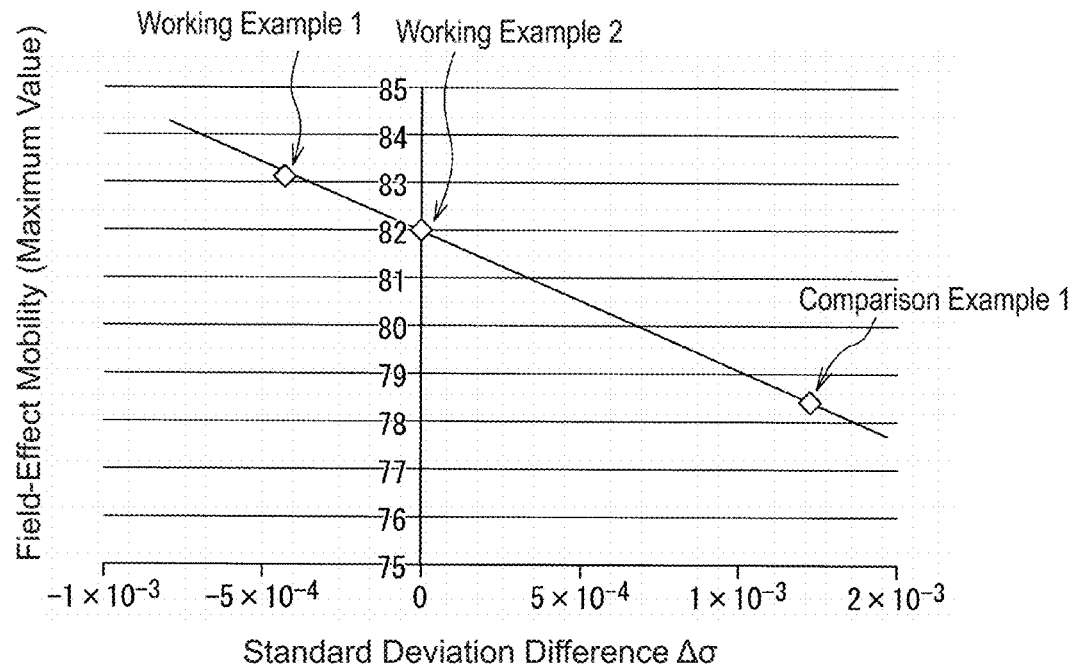
FIG. 6B is a graph showing the relationship between the standard deviation difference $\Delta\sigma$ and the maximum value of field-effect mobility for when n=2.

FIGS. 6A and 6B are line graphs illustrating correspondence tables for when the exponent n in the quantity $\Delta D_i^n \times p_i(ave)$ is set to n=2 to obtain the quantity $\Delta D_i^2 \times p_i(ave)$. FIG. 6A shows the correspondence between the corrected average difference $\Delta\mu$ and the maximum value of field-effect mobility as calculated for the insulated-gate semiconductor devices according to Working Example 1, Working Example 2, and Comparison Example 1. Moreover, FIG. 6B shows the correspondence between the standard deviation difference $\Delta\sigma$ and the maximum value of field-effect mobility as calculated for the insulated-gate semiconductor devices according to Working Example 1, Working Example 2, and Comparison Example 1.

As shown in FIG. 6A, even with n=2 in the quantity $\Delta D_i^n \times p_i(\text{ave})$, when the corrected average difference $\Delta\mu$ is less than or equal to 0 ($\Delta\mu \leq 0$), a field-effect mobility of 81.8 or higher can be achieved. Moreover, as shown in FIG. 6B, when the standard deviation difference $\Delta\sigma$ is less than or equal to 0 ($\Delta\sigma \leq 0$), a field-effect mobility of 82 or higher can be achieved.

Figure 7A:
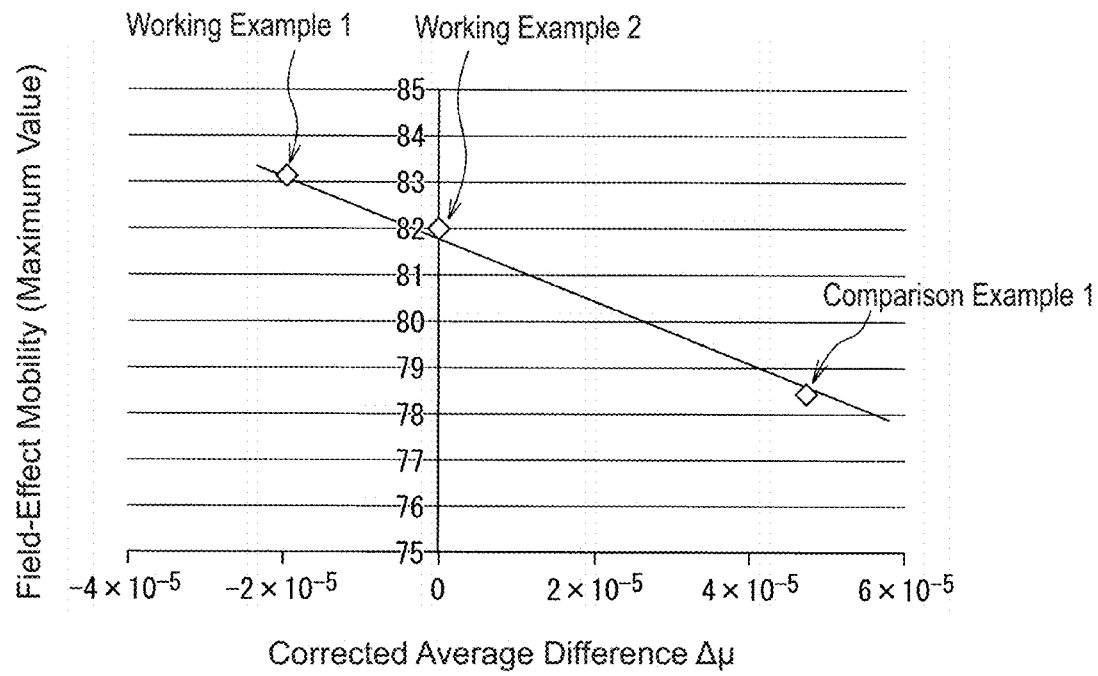
FIG. 7A is a graph showing the relationship between the corrected average difference $\Delta\mu$ and the maximum value of field-effect mobility for when n=3 in the quantity $\Delta D_i'' \times p_i$ (ave) used in the method of evaluating the insulated-gate semiconductor device.
Figure 7B:
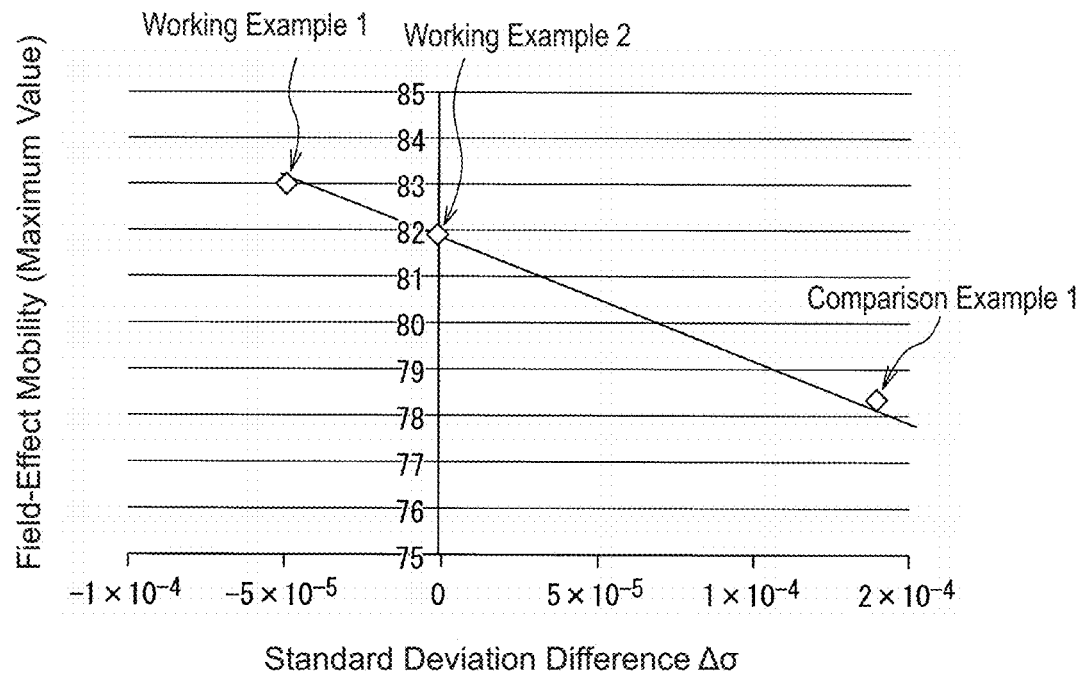
FIG. 7B is a graph showing the relationship between the standard deviation difference $\Delta\sigma$ and the maximum value of field-effect mobility for when n=3.

FIGS. 7A and 7B are line graphs illustrating correspondence tables for when the exponent n in the quantity $\Delta D_i^n \times p_i(\text{ave})$ is set to n=3 to obtain the quantity $\Delta D_i^3 \times p_i(\text{ave})$. FIG. 7A shows the correspondence between the corrected average difference $\Delta\mu$ and the maximum value of field-effect mobility as calculated for the insulated-gate semiconductor devices according to Working Example 1, Working Example 2, and Comparison Example 1. Moreover, FIG. 7B shows the correspondence between the standard deviation difference $\Delta\sigma$ and the maximum value of field-effect mobility as calculated for the insulated-gate semiconductor devices according to Working Example 1, Working Example 2, and Comparison Example 1.

As shown in FIG. 7A, even with n=3 in the quantity $\Delta D_i^n \times p_i(\text{ave})$, when the corrected average difference $\Delta\mu$ is less than or equal to 0 ($\Delta\mu \leq 0$), a field-effect mobility of 81.7 or higher can still be achieved. Moreover, as shown in FIG. 7B, when the standard deviation difference $\Delta\sigma$ is less than or equal to 0 ($\Delta\sigma \leq 0$), a field-effect mobility of 82 or higher can be achieved.

As shown in FIGS. 5A to 7B, even when the value of n in the quantity $\Delta D_i^n \times p_i(\text{ave})$ is changed, field-effect mobility becomes increasingly high as the corrected average difference $\Delta\mu$ becomes increasingly small. In particular, when the corrected average difference $\Delta\mu$ is less than or equal to 0 ($\Delta\mu \leq 0$), a high field-effect mobility of 81 or greater is achieved, which can be evaluated as meaning that the variation in charge distribution at the interface has been significantly reduced. Similarly, field-effect mobility becomes increasingly high as the standard deviation difference $\Delta\sigma$ becomes increasingly small. In particular, when $\Delta\sigma$ is less than or equal to 0 ($\Delta\sigma \leq 0$), a high field-effect mobility of 82 or greater is achieved, which can be evaluated as meaning that the variation in charge distribution at the interface has been significantly reduced. Note that although FIGS. 5A to 7B were described for cases in which the value of n in the quantity $\Delta D_i^n \times p_i(\text{ave})$ was 1 to 3, the relationship between the corrected average difference $\Delta\mu$ and the field-effect mobility and the relationship between the standard deviation difference $\Delta\sigma$ and the field-effect mobility can be characterized in the same manner even when n is 4 or greater. The insulated-gate semiconductor device illustrated in FIG. 1 can be manufactured using the sequence of processes including steps (a) to (e) as described above.

In the method of evaluating the insulated-gate semiconductor device according to Embodiment 1 of the present invention, evaluation metrics are calculated from a phase image obtained using an AFM, and then the calculated evaluation metrics are used to evaluate the variation in charge distribution at the interface. In other words, rather than focusing only on the surface profile of the channel, the charge distribution of the surface is determined from a phase image obtained using an AFM, and the field-effect mobility is evaluated using this phase image. Thus, by defining these corrected average difference $\Delta\mu$ and standard deviation difference $\Delta\sigma$ evaluation metrics that are more highly correlated with field-effect mobility and then implementing improvements selected using these evaluation metrics in the manufacturing process, it becomes possible to provide an insulated-gate semiconductor device in which field-effect mobility is effectively improved. Moreover, the method of evaluating the insulated-gate semiconductor device according to Embodiment 1 makes it possible to evaluate the variation in charge distribution at the interface of the insulated-gate semiconductor device in a standardized manner using these unique calculated evaluation metrics, thereby making it possible to perform the evaluation more objectively and efficiently (that is, with less work involved).

Modification Example

In an insulated-gate semiconductor device manufactured in a modification example of Embodiment 1 of the present invention, in addition to evaluating charge distribution at the interface, the surface profile of the interface is measured using an AFM and controlled to have an arithmetic average roughness Ra of less than or equal to 0.05 nm.

Whether or not the arithmetic average roughness Ra is less than or equal to 0.05 nm can be evaluated using an AFM in a manner similar to in the method of evaluating the insulated-gate semiconductor device according to Embodiment 1. For example, a profile of protrusions and recesses in the measurement segment in the phase image illustrated in FIG. 2 can be extracted using an AFM, and then the extracted profile of protrusions and recesses can be used to calculate the arithmetic average roughness Ra or the root mean square roughness Rq of the measurement segment. The rest of the components of the insulated-gate semiconductor device according to the modification example are the same as the respective components of the same name in the insulated-gate semiconductor device described with reference to FIG. 1 and therefore will not be described again here.

In a method of manufacturing the insulated-gate semiconductor device according to the modification example of Embodiment 1, the arithmetic average roughness Ra of the interface is controlled to be less than or equal to 0.05 nm so as to suppress the distribution of protrusions and recesses. This makes it possible to reduce scattering of carriers due to the roughness, thereby further improving field-effect mobility. Other advantageous effects of the insulated-gate semiconductor device according to the modification example are the same as those of the insulated-gate semiconductor device described with reference to FIG. 1.

Embodiment 2

<Structure of Insulated-Gate Semiconductor Device>

Figure 8:
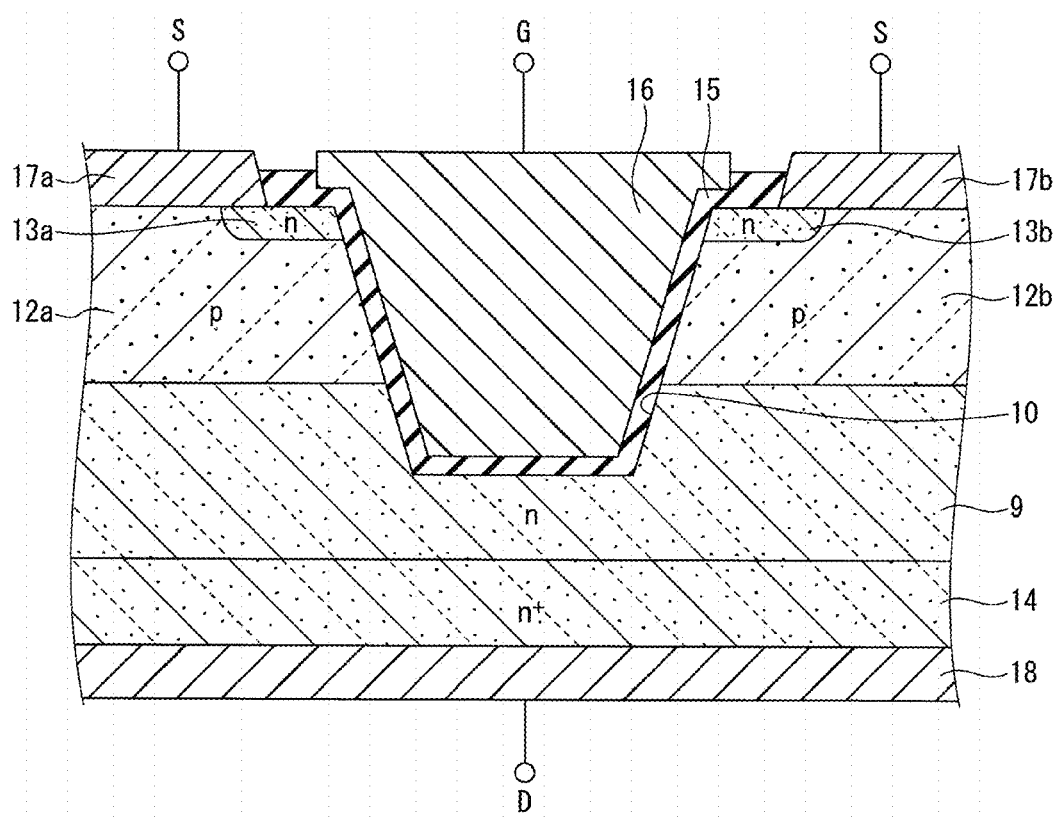
FIG. 8 is a cross-sectional view schematically illustrating a trench-gate insulated-gate semiconductor device manufactured in Embodiment 2 of the present invention.

Although the insulated-gate semiconductor device illustrated in FIG. 1 is a lateral planar-gate MOSFET, the device manufactured in the present invention is not limited to this example and may be embodied in the form of a vertical trench-gate MOSFET such as that illustrated in FIG. 8. An insulated-gate semiconductor device manufactured in Embodiment 2 of the present invention includes a drain region 14 constituted by an $n^+$ SiC semiconductor substrate, an n-type drift region 9 formed on the drain region 14, and p-type base regions (channel formation layers) 12a and 12b embedded in an upper portion of the drift region 9. The drift region 9 can be formed using an epitaxial growth process, for example, while the channel formation layers 12a and 12b can be formed using an ion implantation process and an activation annealing process, or the like. $n^+$ source regions 13a and 13b are selectively formed in upper portions of the channel formation layers 12a and 12b.

In an upper portion of the drift region 9, a trench 10 having a stripe-shaped planar pattern when the principal surface of the insulated-gate semiconductor device is viewed in a front view is formed going through the channel formation layers 12a and 12b and reaching the drift region 9. On the sidewall surfaces and bottom surface of the trench 10, a gate insulating film 15 is formed contacting the channel formation layers 12a and 12b, and inside the trench 10, a gate electrode 16 is formed with the gate insulating film 15 interposed therebeneath. Source electrodes 17a and 17b are formed on the upper surfaces of the source regions 13a and 13b and the channel formation layers 12a and 12b, and a drain electrode 18 is formed on the bottom surface of the drain region 14. Components such as an interlayer insulating film and a field insulating film are not illustrated in the figure. Together, the gate insulating film 15 and the channel formation layers 12a and 12b form an insulated-gate structure.

In the insulated-gate semiconductor device manufactured in Embodiment 2 as illustrated in FIG. 8, the trench 10 extends downward from the (0001) c-plane (the upper surface of the SiC in FIG. 8) in a direction orthogonal to that (0001) c-plane. In other words, similar to in the planar-gate MOSFET illustrated in FIG. 1, the crystal planes of the SiC channel formation layers 12a and 12b that form the interfaces with the gate insulating film 15 of the MOSFET are (1-100) m-planes or (11-20) a-planes. Thus, in the insulated-gate semiconductor device manufactured in Embodiment 2, the charge distributions of these interfaces can be evaluated using the same evaluation method as in the insulated-gate semiconductor device according to Embodiment 1, and a trench-gate insulated-gate semiconductor device having high field-effect mobility can be provided.

Embodiment 3

<Structure of Insulated-Gate Semiconductor Device>

An insulated-gate semiconductor device manufactured in Embodiment 3 of the present invention is a MOSFET having the same configuration as the semiconductor device manufactured in Embodiment 1 and illustrated in FIG. 1. In other words, the insulated-gate semiconductor device manufactured in Embodiment 3 includes an n-type SiC semiconductor substrate 1 and a p-type SiC channel formation layer 2 formed on the semiconductor substrate 1. An $n^+$ source region 3 and an $n^+$ drain region 4 separated from the source region 3 are respectively selectively formed in an upper portion of the channel formation layer 2.

A gate insulating film 5 is formed on the upper surface of the channel formation layer 2 sandwiched between the source region 3 and the drain region 4, and a gate electrode 6 is formed on the gate insulating film 5. Moreover, a source electrode 7 and a drain electrode 8 are respectively formed on and in ohmic contact with the source region 3 and the drain region 4. Together, the gate insulating film 5 and the channel formation layer 2 contacting the gate insulating film 5 form an insulated-gate structure.

<Method of Manufacturing Insulated-Gate Semiconductor Device>

In a method of manufacturing the insulated-gate semiconductor device according to Embodiment 3, the same steps (a) to (e) and film formation processes after step (e) as described above in Embodiment 1 are performed in the same manner and therefore will not be described again here.

<Method of Evaluating Charge Distribution at Interface>

Similar to in Embodiment 1, evaluation metrics (second evaluation metrics) used in a method of evaluating the insulated-gate semiconductor device according to Embodiment 3 are defined, in consideration of the resulting relationship with field-effect mobility, so as to be evaluation metrics that are more highly correlated with field-effect mobility. In Embodiment 3, from the method of evaluating interface charge distribution including steps (f1) to (f7) as described above in Embodiment 1, the processes in step (f1) to step (f3) are performed, but the processes in steps (f4) and after are not performed. In other words, after performing the processes of (f1) obtaining the phase image, (f2) setting the measurement segment, and (f3) extracting the phase shift, field-effect mobility evaluation metrics (second evaluation metrics) that are different from the evaluation metrics (first evaluation metrics) used in Embodiment 1 are calculated on the basis of the phase shift values extracted from the phase image of the measurement segment.

The evaluation metrics used in Embodiment 3 are defined by respectively applying the definitions of roughness parameters: the Density of Summits, the Surface Bearing Index, and the Core Fluid Retention Index, which are used in surface roughness analysis, to the phase shift values p obtained from the phase image. In other words, these parameters are calculated with respect to the phase shift values p as if these phase shift values represent the roughness profile with respect to which the roughness parameters are originally defined. In the present specification, the evaluation metrics used in Embodiment 3 will be referred to simply as "roughness parameters" below.

(Definition of Roughness Parameters)

(i) Density of Summits $R_{ds}$

The Density of Summits (or summit density) $R_{ds}$ used in Embodiment 3 considers the number of summits (peaks) N of local maximums among the phase shift p data points included in a measurement segment of prescribed length x. The Density of Summits $R_{ds}$ therefore represents the number of such summits per unit length and is given by equation (3) below.

$$R_{ds}=N/x \quad (3)$$

When there are more regions in which the phase is advanced (p>0) in the measurement segment, the number of summits N tends to increase. Thus, from equation (3), the more regions in which the phase is advanced (p>0) there are, the greater the Density of Summits $R_{ds}$ becomes. It should also be noted that when the measurement segment is a two-dimensional area instead of being a one-dimensional line, the respective terms in equation (3) can be replaced with two-dimensional equivalents to obtain the Density of Summits $S_{ds}$ for a two-dimensional measurement segment. Moreover, when stripe-shaped level differences are formed in the measurement target surface due to the various processes performed during manufacture and the two-dimensional measurement segment is set so as to run across these level differences, for example, the level differences can be taken into account (such as by correcting values obtained from the level difference portions) when obtaining the two-dimensional Density of Summits $S_{ds}$. Taking such level difference portions into account makes it possible to further increase evaluation accuracy.

(ii) Surface Bearing Index $R_{bi}$

The Surface Bearing Index $R_{bi}$ also may be used as an evaluation metric. First, the root mean square (RMS) roughness $R_q$ is calculated for the phase shift p data points included in the measurement segment of prescribed length x. The root mean square roughness $R_q$ is given by equation (4) below, where k is the number of phase shift p data points, $p_n$ is the respective phase shift p for each of these k data points (n=1 to k, where k is a natural number), and $\mu_k$ is the arithmetic mean of the phase shifts $p_n$ for the k data points.

$$R_q=\sqrt{[\{\Sigma(p_n-\mu_k)^2\}/x]},(n=1\text{ to } k) \quad (4)$$

Figure 9:
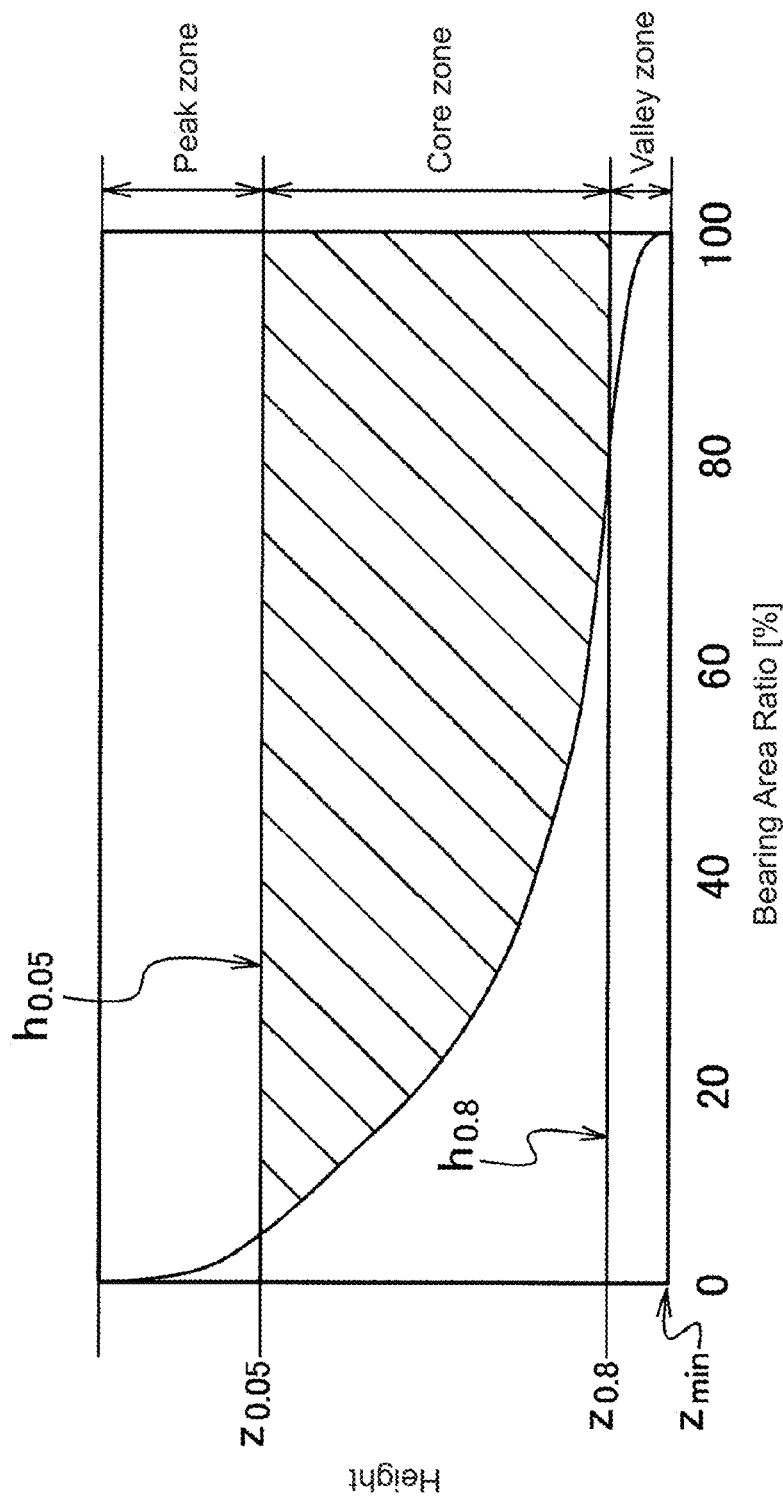
FIG. 9 illustrates a surface bearing area ratio curve used to define the Surface Bearing Index $R_{bi}$ and the Core Fluid Retention Index $R_{ci}$ in a method of evaluating an insulated-gate semiconductor device according to Embodiment 3 of the present invention.

Next, as illustrated in FIG. 9, a $Z_{0.05}$ value on a surface bearing area ratio curve is obtained. Here, the surface bearing area ratio curve is obtained by accumulation of a "height" distribution histogram. Here, as described above, the "height" is actually the phase shift value p. In FIG. 9, the horizontal line $h_{0.05}$ extending out from the $Z_{0.05}$ position passes through the value at which the bearing area ratio is 5%, and the horizontal line $h_{0.8}$ extending out from the $Z_{0.8}$ position passes through the value at which the bearing area ratio is 80%. The regions (zones) created by the two horizontal lines $h_{0.05}$ and $h_{0.8}$ are respectively known as the peak zone, the core zone, and the valley zone. $Z_{0.05}$ represents the distance from the uppermost point on the surface to the height at 5% bearing area, and $Z_{0.8}$ represents the distance from the uppermost point on the surface to the height at 80% bearing area.

Next, the Surface Bearing Index $R_{bi}$ used in Embodiment 3 is defined as shown below in equation (5) using the root mean square roughness $R_q$ and the $Z_{0.05}$ position on the surface bearing area ratio curve.

$$R_{bi} = R_q / Z_{0.05} \tag{5}$$

When there are more regions in which the phase is advanced (p>0) in the measurement segment, the value of the $Z_{0.05}$ in the denominator tends to increase. Thus, from equation (5), the more regions in which the phase is advanced (p>0) there are, the smaller the Surface Bearing Index $R_{bi}$ becomes. Also note that similar to in the case of the Density of Summits $R_{ds}$, when the measurement segment is a two-dimensional area, the respective terms in equation (5) can be replaced with two-dimensional equivalents to obtain the Surface Bearing Index $S_{bi}$ for a two-dimensional measurement segment.

(iii) Core Fluid Retention Index $R_{ci}$

The Core Fluid Retention Index $R_{ci}$ used in Embodiment 3 is defined as shown below in equation (6) using the root mean square roughness $R_q$.

$$R_{ci} = [\{V_v(h_{0.05}) - V_v(h_{0.8})\}/x]/R_q \tag{6}$$

Here, $V_v(h_{0.05})$ represents the area of the void region over the bearing area ratio curve and under the horizontal line $h_{0.05}$ in FIG. 9, and $V_v(h_{0.8})$ represents the area of the void region over the bearing area ratio curve and under the horizontal line $h_{0.8}$. In other words, the quantity $\{V_v(h_{0.05}) - V_v(h_{0.8})\}$ represents the area of the hatched region in the core zone in FIG. 9.

When there are more regions in which the phase is advanced (p>0) in the measurement segment, $V_v(h_{0.05})$ increases and $V_v(h_{0.8})$ decreases. This results in an increase in the area of the void region in the core zone, and thus from equation (6), the more regions in which the phase is advanced (p>0) there are, the greater the Core Fluid Retention Index $R_{ci}$ becomes. Also note that similar to in the case of the Density of Summits $R_{ds}$, when the measurement segment is a two-dimensional area, the respective terms in equation (6) can be replaced with two-dimensional equivalents to obtain the Core Fluid Retention Index $S_{ci}$ for a two-dimensional measurement segment.

Definitions of the roughness parameters used in Embodiment 3, described above, can be found in reference literature such as THE DEVELOPMENT OF METHODS FOR THE CHARACTERISATION OF ROUGHNESS IN THREE DIMENSIONS (European Commission 2008-03-27), for example.

Next, insulated-gate semiconductor devices according to Working Example 1, Working Example 2, Comparison Example 1, and Comparison Example 2 in which the phase shift p was measured in Embodiment 3 will be described. The configurations of the insulated-gate semiconductor devices according to Working Example 1, Working Example 2, and Comparison Example 1 were respectively the same as the configurations of the examples of the same names in Embodiment 1 and therefore will not be described again here. Moreover, the maximum values of field-effect mobility observed in the respective samples of Working Example 1, Working Example 2, and Comparison Example 1 were also respectively the same as the maximum values of field-effect mobility described in Embodiment 1 and are listed below for reference.

Working Example 1: ≈83 cm²/Vs
Working Example 2: ≈82 cm²/Vs
Comparison Example 1: ≈78 cm²/Vs Meanwhile, in Comparison Example 2, in abovementioned step (c) of reducing variation in charge distribution, an additional high-temperature hydrogen annealing process was performed prior to a thermal sacrificial oxidation process equivalent to that used in Comparison Example 1. More specifically, in step (c), first a high-temperature hydrogen annealing process was performed on the SiC surface at approximately 90 Torr (≈1.2×10⁴ Pa) and approximately 1500° C. for approximately 18 minutes in a 100% H₂ atmosphere. Next, a sacrificial thermal oxidation process was performed at 1 atm and approximately 1100° C. for approximately 10 minutes in an O₂ atmosphere in order to form a thermal oxidation film and thereby improve the SiC surface. Then, the thermal oxidation film was removed using an aqueous HF solution.

Next, in step (d), similar to in Working Example 1, an HTO film was formed, and then an annealing process was performed at a temperature of approximately 1250° C. in an NO atmosphere for approximately 60 minutes in order to form a silicon oxide film with a film thickness of approximately 100 nm as the gate insulating film 5 illustrated in FIG. 1. Between step (c) and step (d) the semiconductor substrate 1 illustrated in FIG. 1 was exposed to the air. Next, steps (e) and after were performed to produce insulated-gate semiconductor devices, and a sample was selected from among the manufactured insulated-gate semiconductor devices. Upon evaluating the field-effect mobility of the sample in Comparison Example 2, the maximum value of field-effect mobility was found to be approximately 76 cm²/Vs.

(AFM Measurement)

Next, similar to in Embodiment 1, in each of the samples of Working Example 1, Working Example 2, Comparison Example 1, and Comparison Example 2, the gate insulating film 5 was removed using a wet process performed with an aqueous HF solution in order to expose the upper surface of the channel formation layer 2. Then, step (f1) was performed to obtain phase images, step (f2) was performed to set the measurement segments, and step (f3) was performed to extract the phase shift p from the measurement segments. The conditions used during removal of the silicon oxide film forming the gate insulating film 5 as well as the specifications of the AFM cantilever and other measurement settings and the like were the same as in Embodiment 1. Moreover, in this measurement, five lines were selected as the linear measurement segments, each of these linear segments being defined to avoid crossing vertically extending lines as described above, and the average value of five values calculated by evaluating each measurement segment was set as a representative value for evaluating the measurement target surface.

Figure 10:
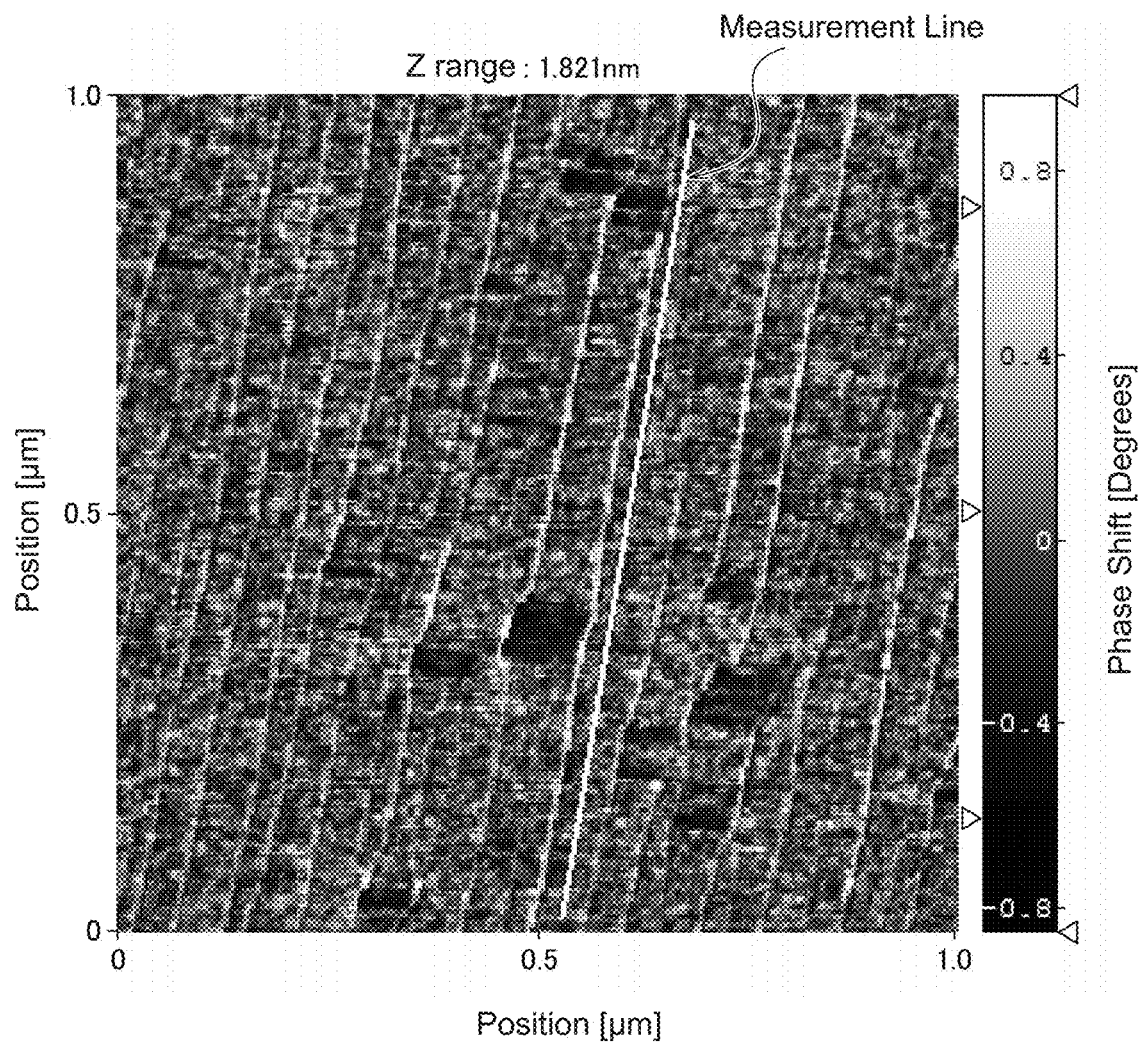
FIG. 10 is a phase image obtained by using an atomic force microscope to measure the surface of a channel formation layer which forms an interface with a gate insulating film in an insulated-gate semiconductor device according to Working Example 2.

FIG. 10 is a phase image of an approximately 1.0 μm×1.0 μm square region obtained in Working Example 2, where one of the five measurement segments selected within this phase image is illustrated as a white measurement line of approximately 1.0 μm in length as an example. Moreover, in FIG. 11, a plurality of phase shift p data points included on the measurement line in FIG. 10 are shown by circle symbols, and these plurality of data points are connected together via line segments to form a peak-and-valley shaped profile.

Figure 12:
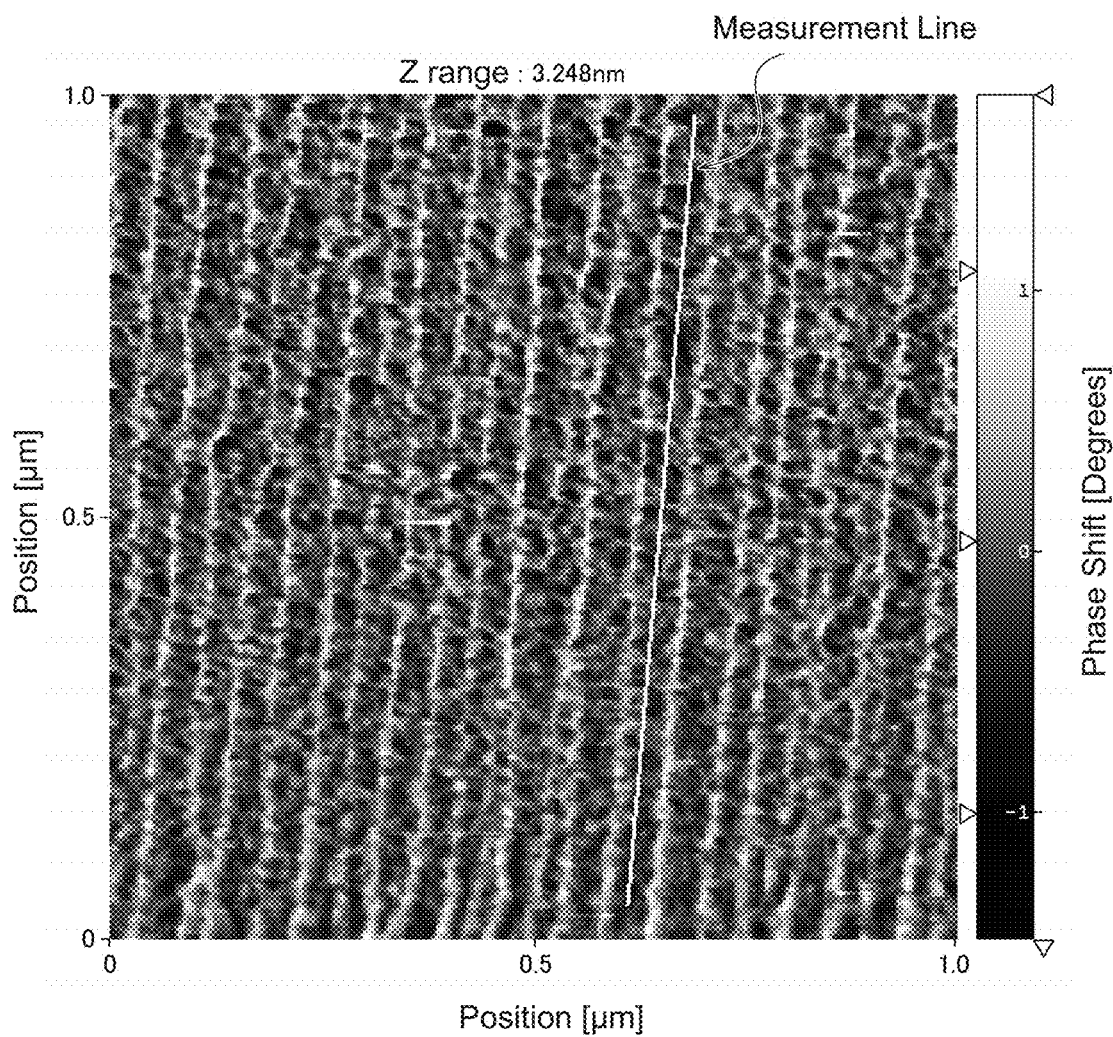
FIG. 12 is a phase image obtained by using an atomic force microscope to measure the surface of a channel formation layer which forms an interface with a gate insulating film in an insulated-gate semiconductor device according to Comparison Example 1.

Moreover, FIG. 12 is a phase image of an approximately 1.0 μm×1.0 μm square region obtained in Comparison Example 1, where a measurement segment selected within this phase image is illustrated as a white measurement line of approximately 1.0 μm in length as an example. Note that the phase image in FIG. 12 contains the same phase image data as the phase image in FIG. 2, but here the length of the selected measurement line is different. Also, on the right side of the phase image in FIG. 12, there is provided a scale showing the phase shift values as in FIG. 2. Furthermore, in FIG. 13, a plurality of phase shift p data points included on the measurement line in FIG. 12 are shown by circle symbols, and these plurality of data points are connected together via line segments to form a peak-and-valley shaped profile.

Figure 11:
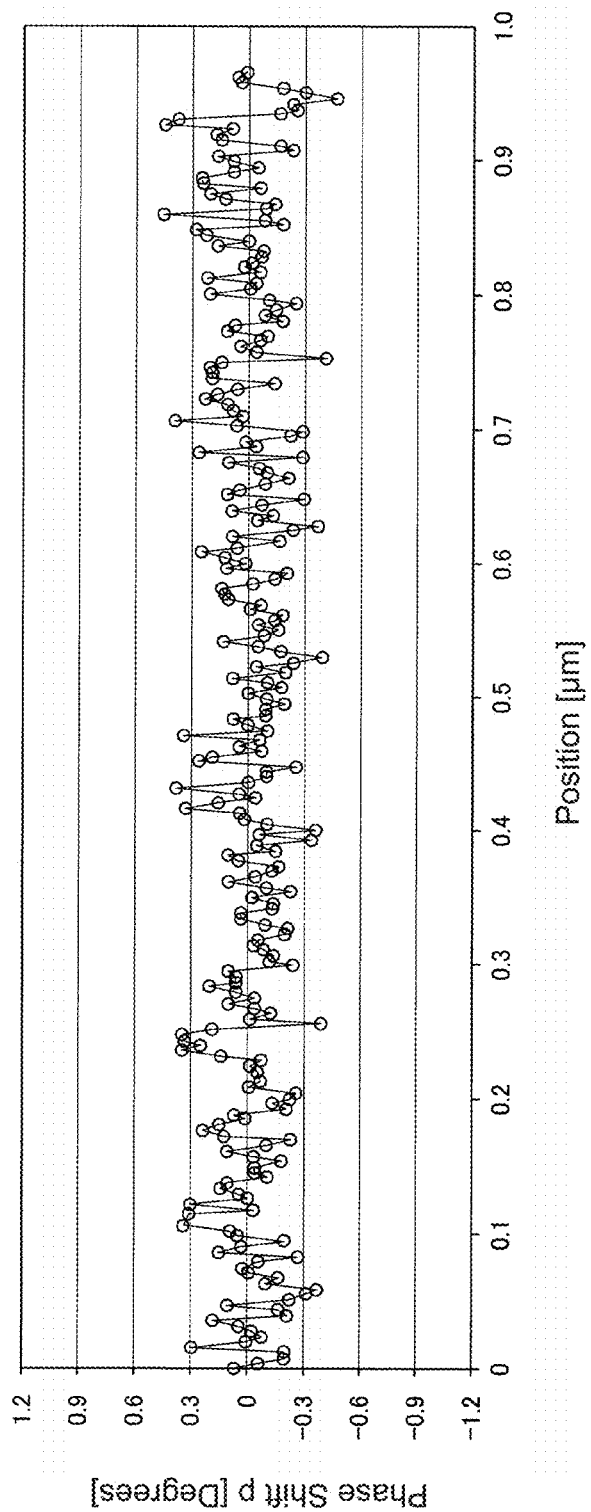
FIG. 11 is a graph showing a phase shift distribution for a measurement segment in FIG. 10.
Figure 13:
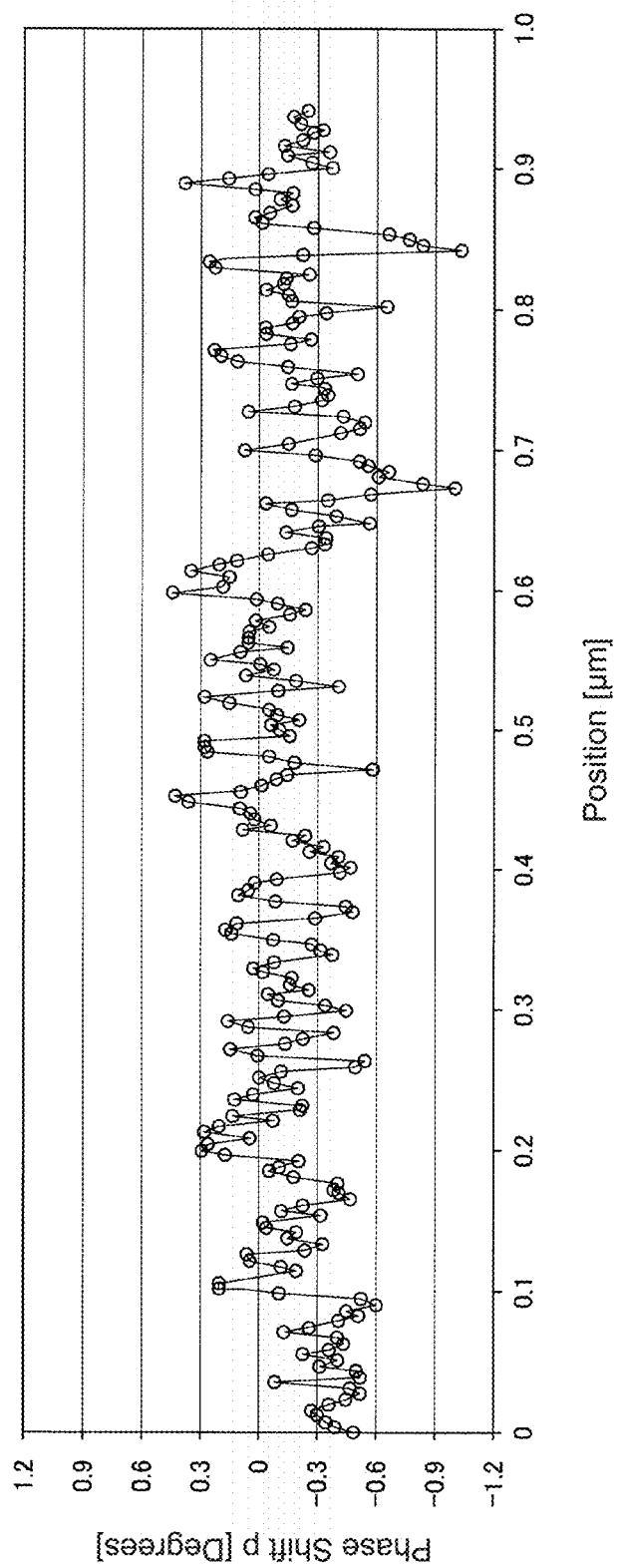
FIG. 13 is a graph showing a phase shift distribution for a measurement segment in FIG. 12.

Phase shift p was extracted from measurement segments as illustrated in FIGS. 11 and 13 in each of Working Example 1, Working Example 2, Comparison Example 1, and Comparison Example 2. Moreover, comparing FIG. 11 and FIG. 13 reveals that in comparison to the measurement segment in Comparison Example 1, the measurement segment in Working Example 2 has more data points measured in positive regions in which the phase is advanced (p>0) and also has less data points measured in negative regions in which the phase is delayed (p<0).

(The Density of Summits $R_{ds}$)

Next, the Density of Summits $R_{ds}$ was calculated for the phase shift p data included on each measurement segment. Once again, in this measurement, an average value of the roughness parameter as derived from five measurement segments was calculated as the value for each working example and comparison example. Using these average values calculated from values respectively obtained for a plurality of measurement segments as the evaluation metrics for the target interface makes it possible to further improve evaluation accuracy. The calculated Density of Summits $R_{ds}$ values are listed below.

Figure 14:
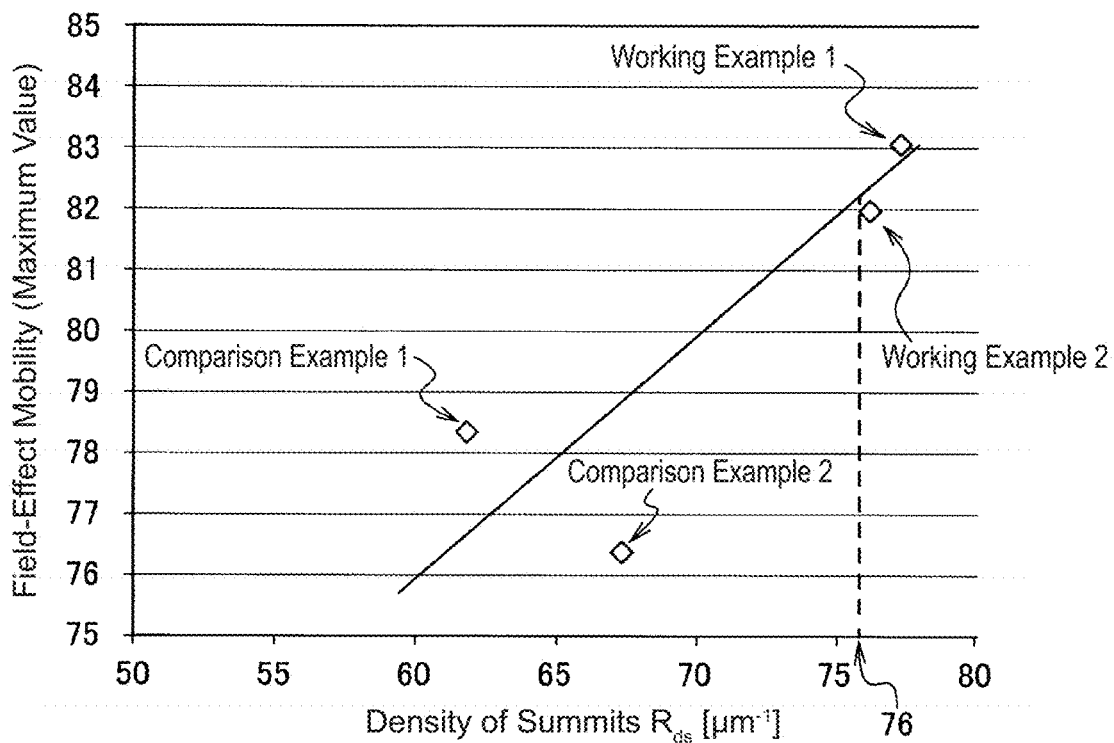
FIG. 14 is a graph showing the relationship between the Density of Summits $R_{ds}$ and the maximum value of field-effect mobility as used in the method of evaluating the insulated-gate semiconductor device according to Embodiment 3.

Working Example 1: ≈78 μm$^{-1}$
Working Example 2: ≈76 μm$^{-1}$
Comparison Example 1: ≈62 μm$^{-1}$
Comparison Example 2: ≈67 μm$^{-1}$ As illustrated in FIG. 14, as the Density of Summits $R_{ds}$ increases (that is, as the number of regions in which the phase is advanced (p>0) increases), the maximum value of field-effect mobility also increases. For example, in Working Example 2 the Density of Summits $R_{ds}$ is approximately 76 μm$^{-1}$ and the associated field-effect mobility is approximately 82, while in Comparison Example 1 the Density of Summits $R_{ds}$ is approximately 62 μm$^{-1}$ and the associated field-effect mobility is approximately 78. Comparing the Density of Summits $R_{ds}$ of both examples reveals that Working Example 2 has a more than 25% higher Density of Summits $R_{ds}$ than Comparison Example 1, while comparing the field-effect mobility of both examples reveals that Working Example 2 has a more than 5% higher field-effect mobility than Comparison Example 1. When the Density of Summits $R_{ds}$ is used as the evaluation metric for phase shift p, controlling the charge distribution at the interface between the channel formation layer 2 and the gate insulating film 5 during the manufacturing process such that the Density of Summits $R_{ds}$ is 76 μm$^{-1}$ or greater makes it possible to more effectively improve field-effect mobility.

(The Surface Bearing Index $R_{bi}$)

Next, the Surface Bearing Index $R_{bi}$ was calculated for the phase shift p data included on each of the measurement segments in Working Example 1, Working Example 2, Comparison Example 1, and Comparison Example 2. The calculated the Surface Bearing Index $R_{bi}$ values are listed below.

Working Example 1: ≈0.39
Working Example 2: ≈0.383
Comparison Example 1: ≈0.432
Comparison Example 2: ≈0.437

Figure 15:
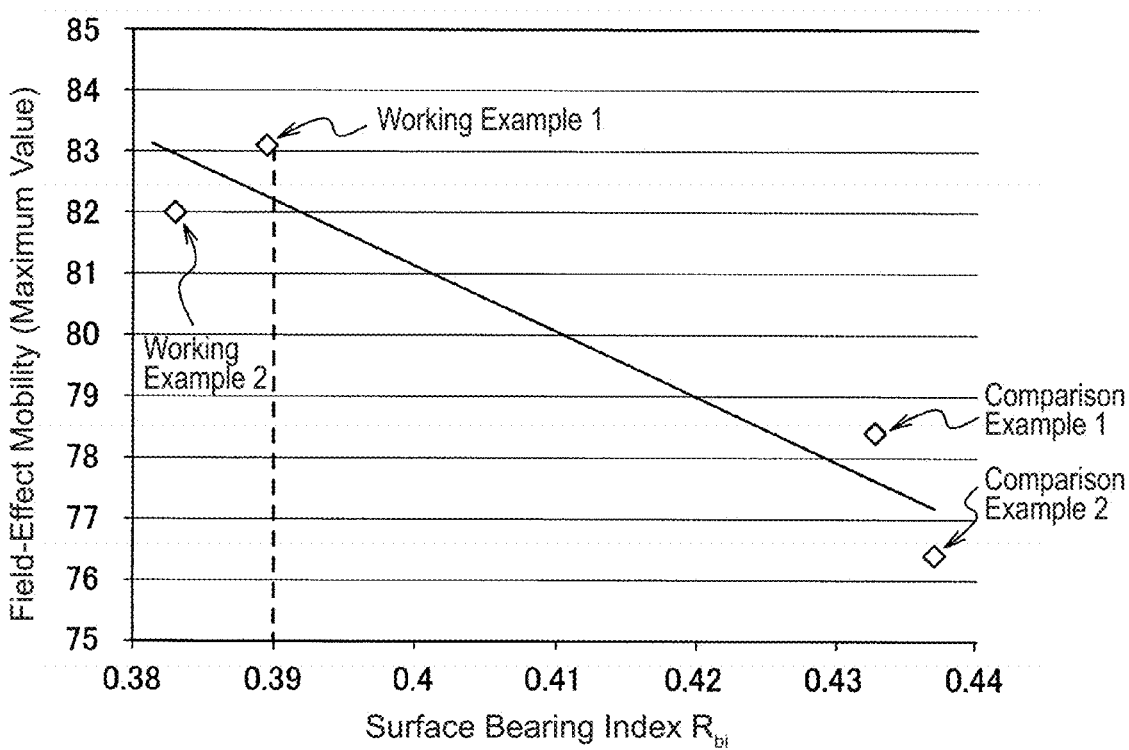
FIG. 15 is a graph showing the relationship between the Surface Bearing Index $R_{bi}$ and the maximum value of field-effect mobility as used in the method of evaluating the insulated-gate semiconductor device according to Embodiment 3.

As illustrated in FIG. 15, as the Surface Bearing Index $R_{bi}$ decreases (that is, as the number of regions in which the phase is advanced (p>0) increases), the maximum value of field-effect mobility increases. For example, in Working Example 1 the Surface Bearing Index $R_{bi}$ is approximately 0.39 and the associated field-effect mobility is approximately 83, while in Comparison Example 1 the Surface Bearing Index $R_{bi}$ is approximately 0.432 and the associated field-effect mobility is approximately 78. Comparing the Surface Bearing Index $R_{bi}$ of both examples reveals that Working Example 1 has an approximately 10% lower Surface Bearing Index $R_{bi}$ than Comparison Example 1, while comparing the field-effect mobility of both examples reveals that Working Example 1 has a more than 5% higher field-effect mobility than Comparison Example 1. When the Surface Bearing Index $R_{bi}$ is used as the evaluation metric for phase shift p, controlling the charge distribution at the interface between the channel formation layer 2 and the gate insulating film 5 during the manufacturing process such that the Surface Bearing Index $R_{bi}$ is 0.39 or less makes it possible to more effectively improve field-effect mobility.

(The Core Fluid Retention Index $R_{ci}$)

Next, the Core Fluid Retention Index $R_{ci}$ was calculated for the phase shift p data included on each of the measurement segments in Working Example 1, Working Example 2, Comparison Example 1, and Comparison Example 2. The calculated the Core Fluid Retention Index $R_{ci}$ values are listed below.

Working Example 1: ≈2.61
Working Example 2: ≈2.52
Comparison Example 1: ≈2.24
Comparison Example 2: ≈2.22

Figure 16:
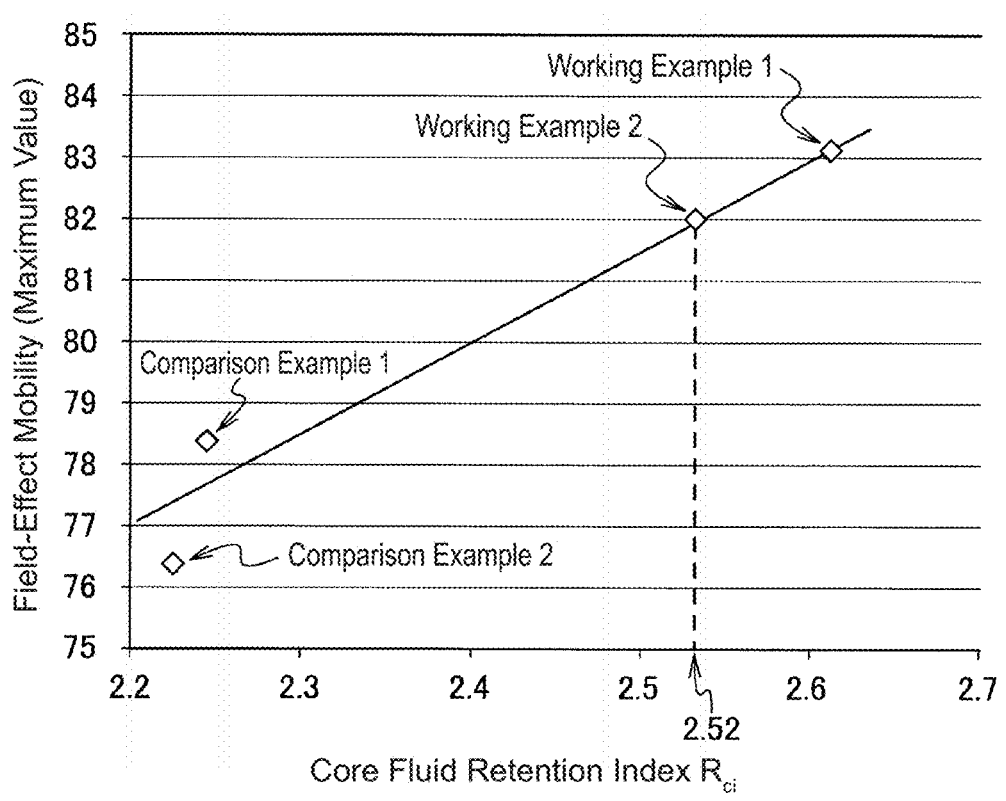
FIG. 16 is a graph showing the relationship between the Core Fluid Retention Index $R_{ci}$ and the maximum value of field-effect mobility as used in the method of evaluating the insulated-gate semiconductor device according to Embodiment 3.

As illustrated in FIG. 16, as the Core Fluid Retention Index $R_{ci}$ increases (that is, as the number of regions in which the phase is advanced (p>0) increases), the maximum value of field-effect mobility also increases. For example, in Working Example 2 the Core Fluid Retention Index $R_{ci}$ is approximately 2.52 and the associated field-effect mobility is approximately 82, while in Comparison Example 1 the Core Fluid Retention Index $R_{ci}$ is approximately 2.24 and the associated field-effect mobility is approximately 78. Comparing the Core Fluid Retention Index $R_{ci}$ of both examples reveals that Working Example 2 has a more than 12% higher Core Fluid Retention Index $R_{ci}$ than Comparison Example 1, while comparing the field-effect mobility of both examples reveals that Working Example 2 has a more than 5% higher field-effect mobility than Comparison Example 1. When the Core Fluid Retention Index $R_{ci}$ is used as the evaluation metric for phase shift p, controlling the charge distribution at the interface between the channel formation layer 2 and the gate insulating film 5 during the manufacturing process such that the Core Fluid Retention Index $R_{ci}$ is 2.52 or greater makes it possible to more effectively improve field-effect mobility.

As described above, in the method of evaluating an insulated-gate semiconductor device according to Embodiment 3, the Density of Summits $R_{ds}$, the Surface Bearing Index $R_{bi}$, and the Core Fluid Retention Index $R_{ci}$ are set as evaluation metrics that are more highly correlated with field-effect mobility. Moreover, by implementing improvements obtained by using these selected evaluation metrics in the manufacturing process, it becomes possible to provide an insulated-gate semiconductor device in which field-effect mobility is effectively improved. Furthermore, similar to in Embodiment 1, the method of evaluating an insulated-gate semiconductor device according to Embodiment 3 makes it possible to evaluate the insulated-gate semiconductor device more objectively and efficiently (that is, with less work involved). In addition, as described above, when using the Density of Summits $R_{ds}$, the Surface Bearing Index $R_{bi}$, and the Core Fluid Retention Index $R_{ci}$ of the phase shift p, in each case it can be determined that field-effect mobility increases as the number of regions in which the phase is advanced (p>0) increases. The other advantageous effects of Embodiment 3 are the same as in Embodiments 1 and 2.

Other Embodiments

Although the present invention was described with reference to Embodiments 1 through 3 above, the descriptions or drawings of this disclosure should not be understood to limit the present invention in any way. It should instead be understood that various alternative embodiments, examples, and applied technologies would be apparent to a person skilled in the art based on this disclosure. For example, the wide-bandgap semiconductor is not limited to being SiC, and gallium nitride (GaN) or diamond (C) or the like can also be used.

Moreover, insulated-gate transistors can be classified more generally as MIS transistors. MIS transistors include MISFETs and MISSITs. Furthermore, the present invention is not limited to being applied to MOSFETs and can also be applied to other insulated-gate semiconductor devices such as insulated-gate bipolar transistors (IGBT).

In the method of evaluating the insulated-gate semiconductor devices according to Embodiments 1 and 2, the corrected average difference $\Delta\mu$ and the standard deviation difference $\Delta\sigma$ do not necessarily both need to be used, and the charge distribution of the interface can be evaluated using either one of these evaluation metrics alone. Similarly, in the method of evaluating an insulated-gate semiconductor device according to Embodiment 3, all three roughness parameters (the Density of Summits $R_{ds}$, the Surface Bearing Index $R_{bi}$, and the Core Fluid Retention Index $R_{ci}$) do not necessarily need to be used at the same time. Performing the evaluation using at least one of these three roughness parameters still makes it possible to provide an insulated-gate semiconductor device in which field-effect mobility is effectively improved.

Moreover, the present invention can also be achieved by partially combining aspects of any of Embodiments 1 to 3, such as by using the evaluation method described in Embodiment 3 on the vertical trench-gate MOSFET described in Embodiment 2, for example. As described above, the present invention includes various other embodiments and the like that are not explicitly described above. Furthermore, the technical scope of the present invention is defined only by the characterizing features of the invention as set forth in the claims, which are appropriately derived from the descriptions above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of evaluating an insulated-gate semiconductor device having an insulated-gate structure comprising a channel formation layer made of a wide-bandgap semiconductor and a gate insulating film formed contacting the channel formation layer, comprising:

removing the gate insulating film in order to expose a surface of the channel formation layer;

taking a phase image of the exposed surface of the channel formation layer using a phase mode of an atomic force microscope;

evaluating a surface condition of the exposed surface of the channel formation layer by calculating an evaluation metric from phase shift values in the phase image and by determining whether the evaluation metric satisfies a prescribed condition; and determining that the insulated-gate semiconductor device is acceptable when the evaluation metric satisfied said prescribed condition.

2. The method according to claim 1, wherein the calculating the evaluation matric includes calculating $\Delta D_i^n \times p_i$(ave) and $\Delta D_j^n \times p_j$(ave) for a linear measurement segment in the phase image, where n is a non-negative integer exponent, $\Delta D_i$ is a length of the ith negative measurement segment defined in the linear measurement segment in the phase image in which phase shift value p is continuously negative, and $p_i$(ave) is an arithmetic means of the phase shift value p in the ith negative measurement segment, and $\Delta D_j$ is a length of the jth positive measurement segment defined in the linear measurement segment in which phase ship value p is continuously positive, and $p_j$(ave) is an arithmetic means of the phase shift value p in the jth positive measurement segment.

3. The method according to claim 2,
wherein the evaluation metric is Corrected Average Difference $\Delta\mu$ given by the following equation:

$$\Delta\mu = |\text{Average } \mu_{(p<0)}| - (\text{Average } \mu_{(p>0)}),$$

where Average $\mu_{(p<0)}$ is an arithmetic means of $\Delta D_i^n \times p_i$(ave) over all of the negative measurement segments, and Average $\mu_{(p>0)}$ is an arithmetic means of $\Delta D_j^n \times p_j$(ave) over all of the positive measurement segments, wherein said prescribed condition is that the Corrected Average Difference $\Delta\mu$ is less than or equal to 0.

4. The method according to claim 2,
wherein the evaluation metric is Standard Deviation Difference $\Delta\sigma$ given by the following equation:

$$\Delta\sigma = (\text{Standard Deviation } \sigma_{(p<0)}) - (\text{Standard Deviation } \sigma_{(p>0)}),$$

where Standard Deviation $\sigma_{(p<0)}$ is a standard deviation of $\Delta D_i^n \times p_i$(ave) for all of the negative measurement segments having negative phase shift value p, and Standard Deviation $\sigma_{(p>0)}$ is a standard deviation of $\Delta D_j'' \times p_j(\text{ave})$ for all of the positive measurement segments having positive phase shift value p, and Corrected Average Difference $\Delta\mu$. And wherein said prescribed condition is that the Standard Deviation Difference $\Delta\sigma$ is less than or equal to 0.

5. The method according to claim 1, wherein the evaluation metric is Density of Summits calculated by regarding phase shift values in the phase image as height values in a surface profile, and wherein said prescribed condition is that an arithmetic mean value of the Densities of Summits calculated for 5 linear measurement segments in the phase image is greater than or equal to 76 $\mu m^{-1}$.

6. The method according to claim 1, wherein the evaluation metric is Surface Bearing Index calculated by regarding phase shift values in the phase image as height values in a surface profile, and wherein said prescribed condition is that an arithmetic mean value of the Surface Bearing Indices calculated for 5 linear measurement segments in the phase image is less than or equal to 0.39.

7. The method according to claim 1, wherein the evaluation metric is Core Fluid Retention Index calculated by regarding phase shift values in the phase image as height values in a surface profile, and wherein said prescribed condition is that an arithmetic mean value of the Core Fluid Retention Indices calculated for 5 linear measurement segments in the phase image is greater than or equal to 2.52.

* * * * *